(12) United States Patent
Matsumoto

(10) Patent No.: US 8,969,837 B2
(45) Date of Patent: Mar. 3, 2015

(54) MULTI CHARGED PARTICLE BEAM WRITING METHOD, AND MULTI CHARGED PARTICLE BEAM WRITING APPARATUS

(71) Applicant: NuFlare Technology, Inc., Yokohama (JP)

(72) Inventor: Hiroshi Matsumoto, Kanagawa (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 14/297,030

(22) Filed: Jun. 5, 2014

(65) Prior Publication Data

US 2014/0361193 A1 Dec. 11, 2014

(30) Foreign Application Priority Data

Jun. 10, 2013 (JP) ................................. 2013-121717

(51) Int. Cl.
G21K 1/087 (2006.01)
H01J 37/317 (2006.01)
G21K 5/04 (2006.01)

(52) U.S. Cl.
CPC .............. H01J 37/3177 (2013.01); G21K 5/04 (2013.01)
USPC ............... 250/492.22; 250/396 R; 250/492.1; 250/492.2; 250/492.23

(58) Field of Classification Search
USPC ................. 250/396 R, 492.1, 492.22, 492.2, 250/492.23, 492.3
See application file for complete search history.

(56) References Cited

U.S. PATENT DOCUMENTS

| | | | |
|---|---|---|---|
| 3,875,416 A * | 4/1975 | Spicer | 250/492.1 |
| 6,556,648 B1 * | 4/2003 | Bal et al. | 378/34 |
| 6,759,666 B2 * | 7/2004 | Nagata et al. | 250/492.22 |
| 7,368,738 B2 * | 5/2008 | Platzgummer | 250/492.23 |
| 7,742,062 B2 * | 6/2010 | Oisel et al. | 345/629 |
| 2005/0242302 A1 * | 11/2005 | Platzgummer et al. | 250/492.22 |
| 2005/0242303 A1 * | 11/2005 | Platzgummer | 250/492.22 |
| 2014/0017349 A1 * | 1/2014 | Yashima et al. | 425/174.4 |
| 2014/0124684 A1 * | 5/2014 | Matsumoto et al. | 250/492.3 |

FOREIGN PATENT DOCUMENTS

JP 2014-112639 A 6/2014

* cited by examiner

*Primary Examiner* — Michael Logie
(74) *Attorney, Agent, or Firm* — Oblon, Spivak, McClelland, Maier & Neustadt, L.L.P.

(57) ABSTRACT

A multi charged particle beam writing method includes dividing a maximum irradiation time per a shot into a digit number of first irradiation time periods, each of which is calculated by multiplying a corresponding second gray scale value by the quantization unit, where second gray scale values are gray scale values defined in decimal numbers converted from each digit value of data of binary numbers; dividing second irradiation time periods, which are a part of the first irradiation time periods into third irradiation time periods; dividing irradiation of each beam into the first irradiation steps of the third irradiation time periods and second irradiation steps of the remaining undivided first irradiation time periods; and irradiating a target object, in order, with the multi beams such that the groups are respectively composed of combination of at least two irradiation steps of first irradiation steps and second irradiation steps and the groups continue in order.

11 Claims, 24 Drawing Sheets

| k | tk |
|---|---|
| 0 | Δ |
| 1 | 2Δ |
| 2 | 4Δ |
| 3 | 8Δ |
| 4 | 16Δ |
| 5 | 32Δ |
| 6 | 64Δ |
| 7 | 128Δ |
| 8 | 256Δ |
| 9 | 512Δ |

FIG. 7

| EXPOSURE STEP | EXPOSURE TIME 1 | EXPOSURE TIME 2 | TOTAL OF EXPOSURE TIME |
|---|---|---|---|
| 1 | t0 = Δ | t9 = 512Δ | 513Δ |
| 2 | t1 = 2Δ | t8 = 256Δ | 258Δ |
| 3 | t2 = 4Δ | t7 = 128Δ | 132Δ |
| 4 | t3 = 8Δ | t6 = 64Δ | 72Δ |
| 5 | t4 = 16Δ | t5 = 32Δ | 48Δ |

FIG. 8

| k | tk |
|---|---|
| 0 | Δ |
| 1 | 2Δ |
| 2 | 4Δ |
| 3 | 8Δ |
| 4 | 16Δ |
| 5 | 32Δ |
| 6 | 64Δ |
| 7 | 128Δ |
| 8a | 128Δ |
| 8b | 128Δ |
| 9a | 128Δ |
| 9b | 128Δ |
| 9c | 128Δ |
| 9d | 128Δ |

FIG. 11

| Exposure Step | Exposure Time 1 | Exposure Time 2 | Total of Exposure Time |
|---|---|---|---|
| 1 | t0 = Δ | t9d = 128Δ | 129Δ |
| 2 | t1 = 2Δ | t9c = 128Δ | 130Δ |
| 3 | t2 = 4Δ | t9b = 128Δ | 132Δ |
| 4 | t3 = 8Δ | t9a = 128Δ | 136Δ |
| 5 | t4 = 16Δ | t8b = 128Δ | 144Δ |
| 6 | t5 = 32Δ | t8a = 128Δ | 160Δ |
| 7 | t6 = 64Δ | t7 = 128Δ | 192Δ |

FIG. 12

| Exposure Step | Exposure Time1 | Exposure Time2 | Total of Exposure Time |
|---|---|---|---|
| 1 | t0 = Δ | t9a = 144Δ | 145Δ |
| 2 | t1 = 2Δ | t9b = 144Δ | 146Δ |
| 3 | t2 = 4Δ | t9c = 142Δ | 146Δ |
| 4 | t3 = 8Δ | t8a = 138Δ | 146Δ |
| 5 | t4 = 16Δ | t7 = 128Δ | 144Δ |
| 6 | t5 = 32Δ | t8b = 118Δ | 150Δ |
| 7 | t6 = 64Δ | t9d = 82Δ | 146Δ |

FIG. 13

| Exposure Step | Exposure Time 1 | Exposure Time2 | Exposure Time3 | Total |
|---|---|---|---|---|
| 1 | Δ | 128 Δ | 128 Δ | 257 Δ |
| 2 | 32 Δ | 64 Δ | 158 Δ | 254 Δ |
| 3 | 8 Δ | 2 Δ | 256 Δ | 266 Δ |
| 4 | 4 Δ | 16 Δ | 226 Δ | 246 Δ |

FIG. 25

| Exposure Step | Exposure Time 1 | Exposure Time2 | Exposure Time3 | Exposure Time4 | Total |
|---|---|---|---|---|---|
| 1 | 4Δ | 16Δ | 64Δ | 256Δ | 340Δ |
| 2 | 2Δ | 8Δ | 128Δ | 204Δ | 342Δ |
| 3 | Δ | 32Δ | 128Δ | 180Δ | 341Δ |

FIG. 26

MULTI CHARGED PARTICLE BEAM WRITING METHOD, AND MULTI CHARGED PARTICLE BEAM WRITING APPARATUS

CROSS-REFERENCE TO RELATED APPLICATION

This application is based upon and claims the benefit of priority from the prior Japanese Patent Application No. 2013-121717 filed on Jun. 10, 2013 in Japan, the entire contents of which are incorporated herein by reference.

BACKGROUND OF THE INVENTION

1. Field of the Invention

The present invention relates to a multi charged particle beam writing method and a multi charged particle beam writing apparatus. More specifically, for example, the present invention relates to a blanking method in writing with multiple beams.

2. Description of Related Art

The lithography technique that advances miniaturization of semiconductor devices is extremely important as being a unique process whereby patterns are formed in the semiconductor manufacturing. In recent years, with high integration of LSI, the line width (critical dimension) required for semiconductor device circuits is decreasing year by year. The electron beam (EB) writing technique, which intrinsically has excellent resolution, is used for writing or "drawing" a pattern on a wafer and the like with electron beams.

As an example employing the electron beam writing technique, a writing apparatus using multiple beams (multi-beams) can be cited. Compared with the case of writing a pattern by using a single electron beam, since it is possible to emit multiple beams at a time in multiple writing, the throughput can be greatly increased. In the writing apparatus employing a multi-beam system, for example, multiple beams are formed by letting an electron beam emitted from an electron gun assembly pass through a mask with a plurality of holes, blanking control is performed for each of the beams, and each unblocked beam is reduced by an optical system and deflected by a deflector so as to irradiate a desired position on a target object or "sample" (refer to, e.g., Japanese Patent Application Laid-open (JP-A) No. 2006-261342).

In the multi-beam writing, the dose of an individual beam is individually controlled by an irradiation time. For highly accurately controlling the dose of each beam, it is necessary to carry out blanking control at high speed to perform a beam ON/OFF control. Conventionally, in a writing apparatus of a multi-beam system, a blanking control circuit for each beam is placed on a blanking plate where each blanking electrode of multiple beams is arranged. Controlling is asynchronously performed for each beam. For example, a trigger signal for causing a beam to be ON is sent to control circuits of all the beams. In responsive to the trigger signal, the control circuit of each beam applies a beam-on voltage to an electrode and, simultaneously, starts counting the irradiation time period by a counter. Then, when the irradiation time has been completed, a beam-off voltage is applied. In performing such a control, a 10-bit control signal has been used, for example. However, since the space for placing a circuit on a blanking plate and the amount of current to be used are restricted, there is no other alternative but to have an uncomplicated circuit for the amount of information of control signals. Therefore, it has been difficult to build in a blanking circuit that can perform an operation of high speed and high precision. Further, installing a blanking control circuit for each beam on a blanking plate restricts to narrow the pitch of multiple beams. By contrast, when placing a control circuit for each beam outside the writing apparatus body and connecting each of them by wiring in order to secure a space for installing the circuit, since the wiring becomes long, there is a problem that a crosstalk problem becomes more prominent.

BRIEF SUMMARY OF THE INVENTION

In accordance with one aspect of the present invention, a multi charged particle beam writing method includes converting, for each shot of beams of multiple charged particle beams, a respective first gray scale value of each beam of the multiple charged particle beams, which is obtained by dividing an individual irradiation time period of the each beam by a quantization unit, into respective data of binary numbers of a predetermined digit number set in advance;

dividing a maximum irradiation time period per shot of beams of the multiple charged particle beams into a plurality, being the predetermined digit number, of first irradiation time periods, each of which is calculated by multiplying a corresponding second gray scale value of a plurality of second gray scale values by the quantization unit, where the plurality of second gray scale values are gray scale values defined in decimal numbers converted from each digit value of data of binary numbers of the predetermined digit number;

dividing a plurality of second irradiation time periods, which are a part of the plurality of first irradiation time periods into a plurality of third irradiation time periods;

dividing irradiation of each beam of the multiple charged particle beams by using the plurality of third irradiation time periods and remaining undivided plurality of first irradiation time periods, into the first irradiation steps which are irradiation steps of the plurality of third irradiation time periods and second irradiation steps which are irradiation steps of the remaining undivided plurality of first irradiation time periods; and irradiating, for each group of a plurality of groups in the each shot of beams, a target object, in order, with the multiple charged particle beams such that the plurality of groups are respectively composed of combination of at least two irradiation steps of first irradiation steps and second irradiation steps and the plurality of groups continue in order.

In accordance with another aspect of the present invention, a multi charged particle beam writing apparatus includes a stage configured to mount a target object thereon and to be continuously movable;

an emission unit configured to emit a charged particle beam;

an aperture member, in which a plurality of openings are formed, configured to form multiple beams by letting a region including a whole of the plurality of openings be irradiated with the charged particle beam and letting portions of the charged particle beam respectively pass through a corresponding opening of the plurality of openings;

a plurality of blankers configured to respectively perform blanking deflection of a corresponding beam in the multiple beams having passed through the plurality of openings of the aperture member;

a blanking aperture member configured to block each beam having been deflected to be in a beam-off state by the plurality of blankers; and a deflection control unit configured to control a corresponding blanker of the plurality of blankers such that a maximum irradiation time period per shot of beams of the multiple beams is divided into a plurality, being a predetermined digit number set in advance, of first irradiation time periods, each of which is calculated by multiplying a corresponding second gray scale value of a plurality of second gray scale values by a quantization unit, where the plurality of second gray scale values are gray scale values defined in decimal numbers converted from each digit value of data of binary numbers of the predetermined digit number, a plurality of second irradiation time periods, which are a part of the plurality of first irradiation time periods, are divided into a plurality of third irradiation time periods, irradiation of each beam of the multiple charged particle beams by using the plurality of third irradiation time periods and remaining undivided plurality of first irradiation time periods is divided into first irradiation steps of the plurality of third irradiation time periods and second irradiation steps of the remaining undivided plurality of first irradiation time periods, and a target object is irradiated, in order, with the multiple charged particle beams such that the plurality of groups are respectively composed of combination of at least two irradiation steps of the first irradiation steps and the second irradiation steps and the plurality of groups continue in order, for each group of a plurality of groups in the each shot of beams.

BRIEF DESCRIPTION OF THE DRAWINGS

FIG. 7 shows a bit processing table representing a relation between each digit number and an irradiation time of each digit in the case of the digit number n=10 according to the first embodiment;

FIG. 8 shows a grouped exposure table according to a comparative example of the first embodiment;

FIG. 11 shows a bit processing table representing a relation between each digit number and an irradiation time of each digit, after the dividing the digit number n=10 according to the first embodiment;

FIG. 12 shows a grouped exposure table according to the first embodiment;

FIG. 13 shows an example of a grouped exposure table after the adjustment according to the first embodiment;

FIG. 25 shows an example of a grouped exposure table according to the fifth embodiment; and FIG. 26 shows another example of a grouped exposure table according to the fifth embodiment.

DETAILED DESCRIPTION OF THE INVENTION

An irradiation method has been examined in which irradiation of each shot of beams is divided into a plurality of irradiation steps obtained by converting an irradiation time of each shot of beams into binary numbers, defining a binary number of each digit in a decimal number to be equivalent to an irradiation time of each digit, and combining the irradiation time of each digit to be digit number irradiation steps, and then, two-digit grouping is sequentially performed by combining a smaller irradiation time and a longer irradiation time to execute irradiation in order of the group.

However, a problem has arisen in the method described above that, since there is a great difference between totals of irradiation time of groups, when performing irradiation of a group which is next to a group whose total irradiation time is extremely short, data transmission may not follow the irradiation operation of the group whose total irradiation time is extremely short, and thereby the data transmission time may be a latency time for a beam irradiation operation. Therefore, a further improvement is needed.

Then, in the following Embodiments, there will be described a writing apparatus and method that can reduce or avoid the latency time for a beam irradiation operation, due to data transmission time, while maintaining restriction of a circuit installation space.

In the following embodiments, there will be described a configuration in which an electron beam is used as an example of a charged particle beam. The charged particle beam is not limited to the electron beam, and other charged particle beam such as an ion beam may also be used.

First Embodiment

Figure 1:
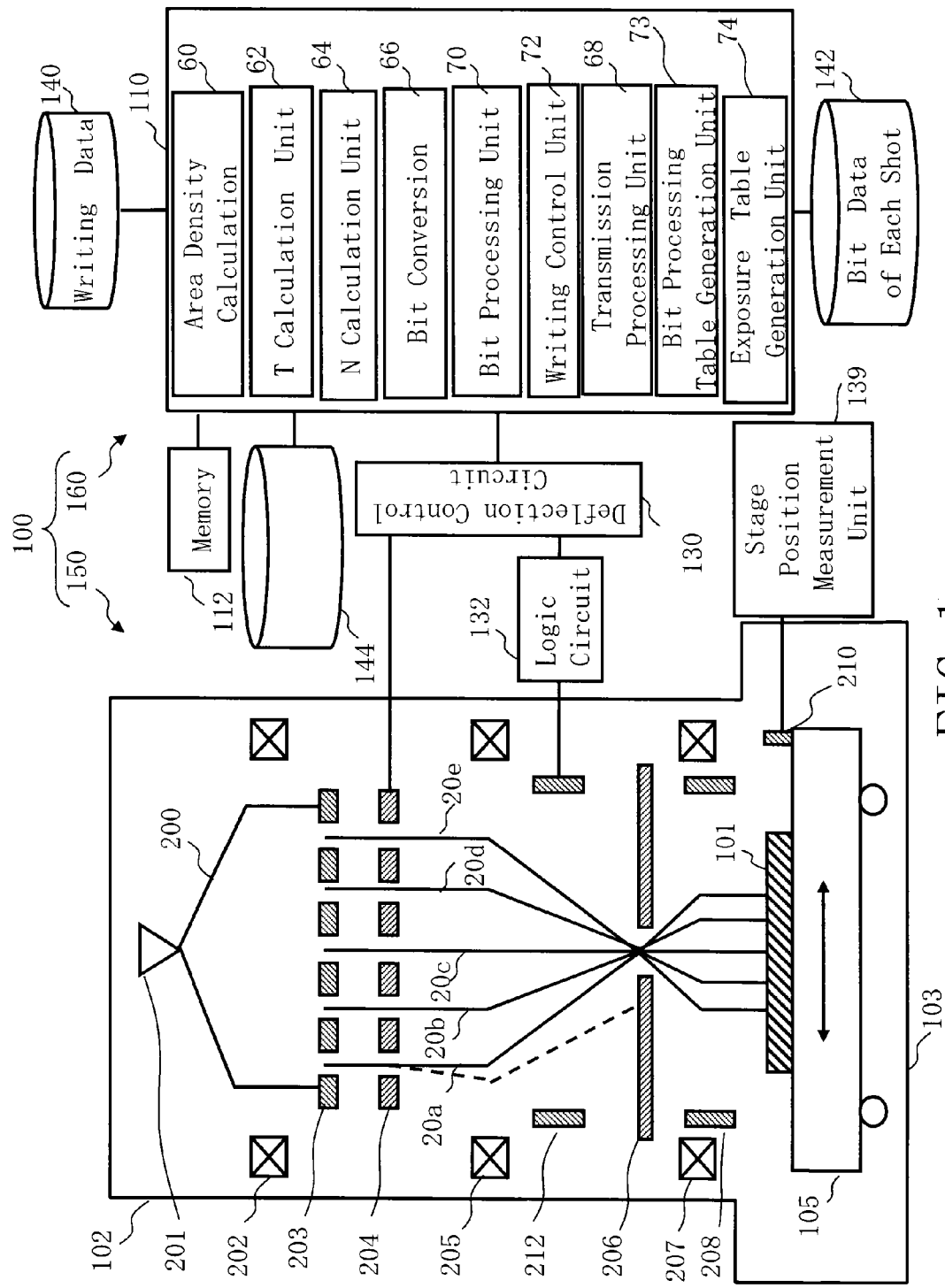
FIG. 1 is a schematic diagram showing a configuration of a writing apparatus according to the first embodiment.

FIG. 1 is a schematic diagram showing a configuration of a writing apparatus according to the first embodiment. In FIG. 1, a writing (or "drawing") apparatus 100 includes a writing unit 150 and a control unit 160. The writing apparatus 100 is an example of a multi charged particle beam writing apparatus. The writing unit 150 includes an electron optical column 102 and a writing chamber 103. In the electron optical column 102, there are arranged an electron gun assembly 201, an illumination lens 202, an aperture member 203, a blanking plate 204, a reducing lens 205, a deflector 212, a limiting aperture member 206, an objective lens 207, and a deflector 208. In the writing chamber 103, there is arranged an XY stage 105. On the XY stage 105, there is placed a target object or "sample" 101 such as a mask serving as a writing target substrate when performing writing. The target object 101 is, for example, an exposure mask used for manufacturing semiconductor devices, or a semiconductor substrate (silicon wafer) on which semiconductor elements are formed. The target object 101 may be, for example, a mask blank on which resist is applied and a pattern has not yet been formed. On the XY stage 105, further, there is arranged a mirror 210 for measuring the position of the XY stage.

The control unit 160 includes a control computer 110, a memory 112, a deflection control circuit 130, a logic circuit 132, a stage position measurement unit 139, and storage devices 140, 142, and 144, such as magnetic disk drives. The control computer 110, the memory 112, the deflection control circuit 130, the stage position measurement unit 139, and the storage devices 140, 142, and 144 are mutually connected through a bus (not shown). Writing data is input into the storage device 140 (storage unit) from the outside to be stored therein.

In the control computer 110, there are arranged an area density calculation unit 60, an irradiation time calculation unit 62, a gray scale value calculation unit 64, a bit conversion unit 66, a bit processing unit 70, a writing control unit 72, a bit processing table generation unit 73, an exposure table generation unit 74, and a transmission processing unit 68. Each function, such as the area density calculation unit 60, the irradiation time calculation unit 62, the gray scale value calculation unit 64, the bit conversion unit 66, the bit processing unit 70, the writing control unit 72, the bit processing table generation unit 73, the exposure table generation unit 74, or the transmission processing unit 68 may be configured by hardware such as an electronic circuit, or by software such as a program implementing these functions. Alternatively, they may be configured by a combination of hardware and software. Data which is input and output to/from the area density calculation unit 60, the irradiation time calculation unit 62, the gray scale value calculation unit 64, the bit conversion unit 66, the bit processing unit 70, the writing control unit 72, the bit processing table generation unit 73, the exposure table generation unit 74, or the transmission processing unit 68, and data being calculated are stored in the memory 112 each time.

FIG. 1 shows a structure necessary for explaining the first embodiment. Other structure elements generally necessary for the writing apparatus 100 may also be included.

Figure 2A:
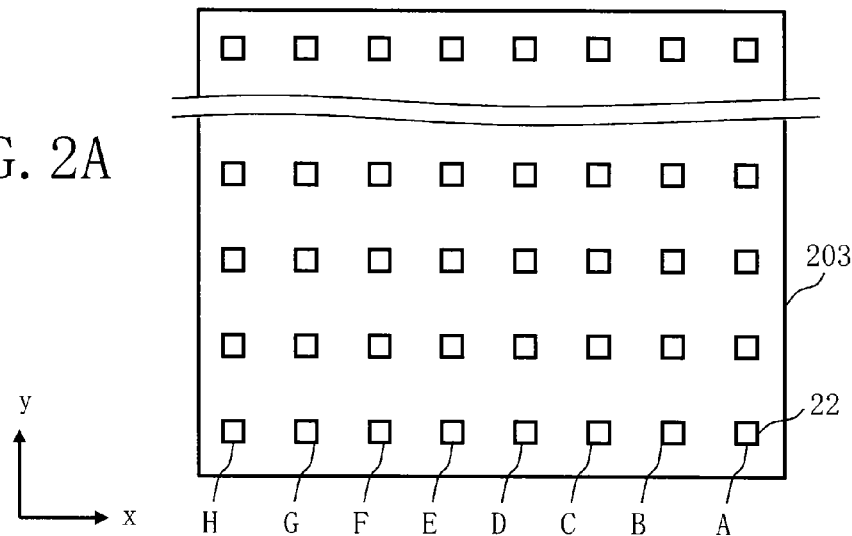
FIGS. 2A and 2B are conceptual diagrams each showing an example of the configuration of an aperture member according to the first embodiment.
Figure 2B:
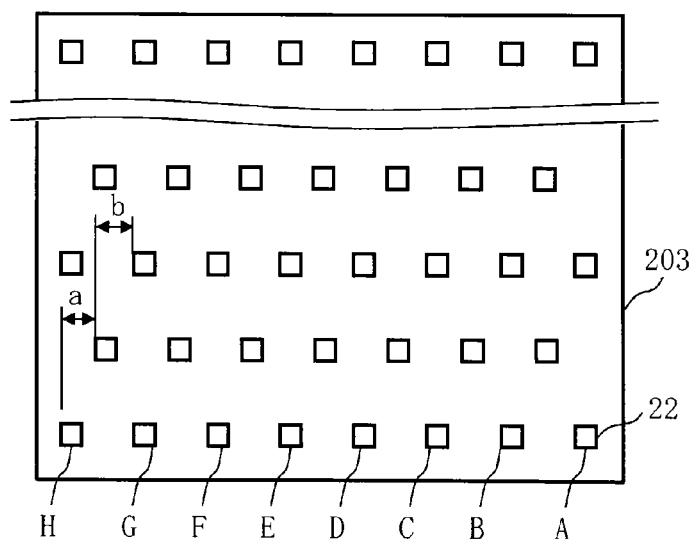

FIGS. 2A and 2B are conceptual diagrams each showing an example of the configuration of an aperture member according to the first embodiment. In FIG. 2A, holes (openings) 22 are formed at a predetermined arrangement pitch, in the shape of a matrix, in the aperture member 203, wherein m×n (m≥2, n≥2) holes 22 are arranged in m columns in the vertical direction (the y direction) and n rows in the horizontal direction (the x direction). In FIG. 2A, holes 22 of 512 (rows)×8 (columns) are formed, for example. Each hole 22 is a quadrangle of the same dimensions and shape. Alternatively, each hole may be a circle of the same circumference. In this case, there is shown an example of each row having eight holes 22 from A to H in the x direction. Multi-beams 20 are formed by letting portions of an electron beam 200 respectively pass through a corresponding hole of a plurality of holes 22. Here, there is shown the case where the holes 22 are arranged in two or more columns and rows in both the x and the y directions, but it is not limited thereto. For example, it is also acceptable to arrange a plurality of holes 22 in only one row or in only one column, that is, in one row where a plurality of holes are arranged as columns, or in one column where a plurality of holes are arranged as rows. Moreover, the method of arranging the holes 22 is not limited to the case of FIG. 2A where holes are aligned in a grid. It is also preferable to arrange the holes 22 as shown in FIG. 2B where the position of each hole in the second row is shifted from the position of each hole in the first row by a dimension "a" in the horizontal direction (x direction), for example. Similarly, it is also preferable to arrange the holes 22 such that the position of each hole in the third row is shifted from the position of each hole in the second row by a dimension "b" in the horizontal direction (x direction).

Figure 3:
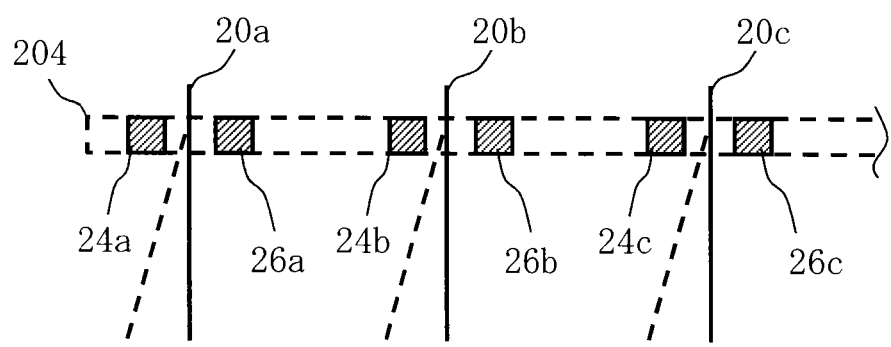
FIG. 3 is a conceptual diagram showing the configuration of a blanking plate according to the first embodiment.
Figure 4:
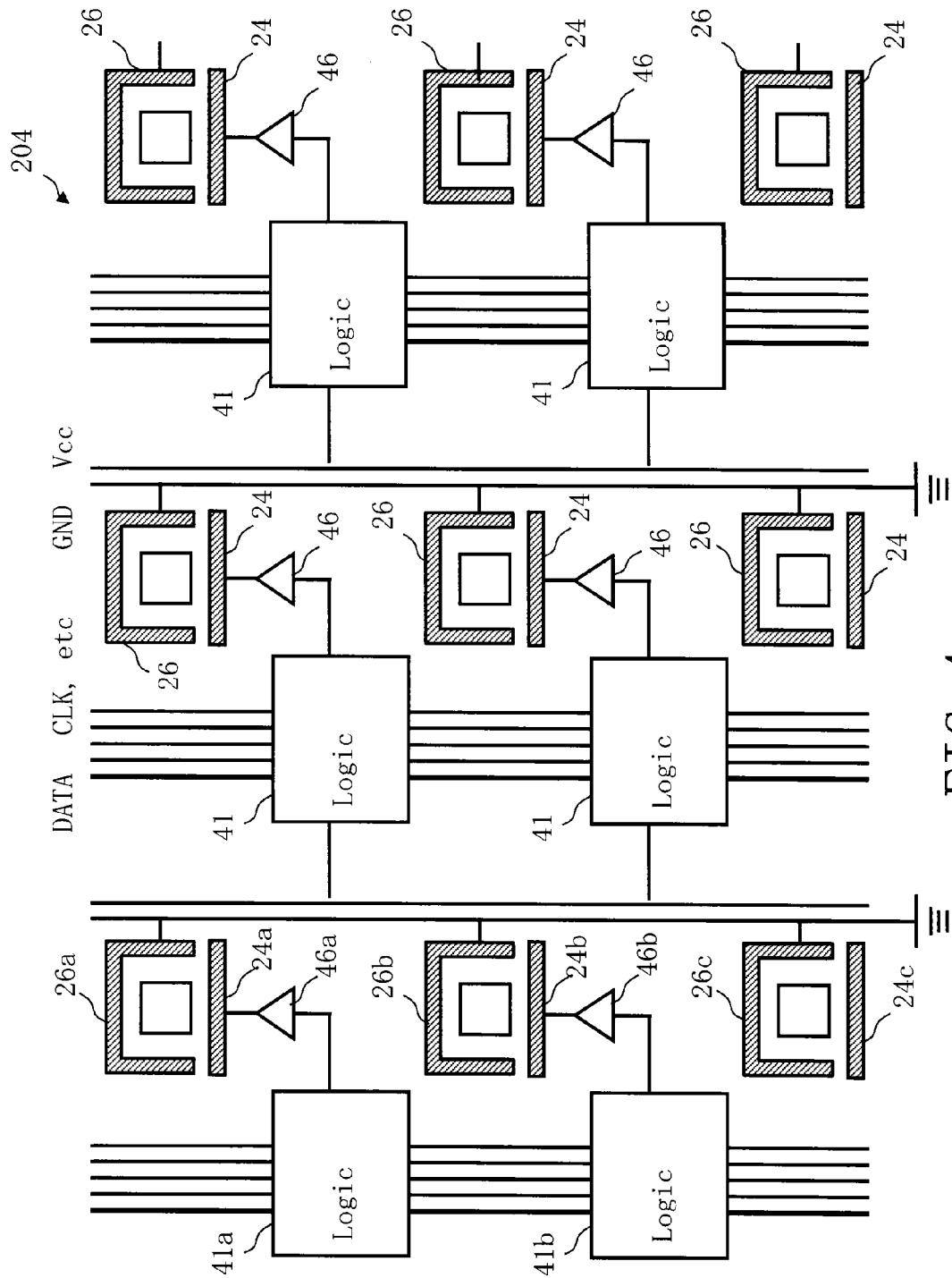
FIG. 4 is a top view conceptual diagram showing the configuration of a blanking plate according to the first embodiment.

FIG. 3 is a conceptual diagram showing the configuration of a blanking plate according to the first embodiment. FIG. 4 is a top view conceptual diagram showing the configuration of a blanking plate according to the first embodiment. In the blanking plate 204, a passage hole is formed to be corresponding to the arrangement position of each hole 22 of the aperture member 203, and a pair of electrodes 24 and 26 (blanker: blanking deflector) is arranged for each passage hole. An amplifier 46 for applying voltage is respectively arranged at one (for example, the electrode 24) of the two electrodes 24 and 26 for each beam. A logic circuit 41 is independently arranged at the amplifier 46 for each beam respectively. The other one (for example, the electrode 26) of the two electrodes 24 and 26 for each beam is grounded. An electron beam 20 passing through a corresponding passage hole is respectively deflected by the voltage applied to the two electrodes 24 and 26 being a pair. Blanking control is performed by this deflection. Thus, a plurality of blankers respectively perform blanking deflection of a corresponding beam in the multiple beams having passed through a plurality of holes 22 (openings) of the aperture member 203.

Figure 5:
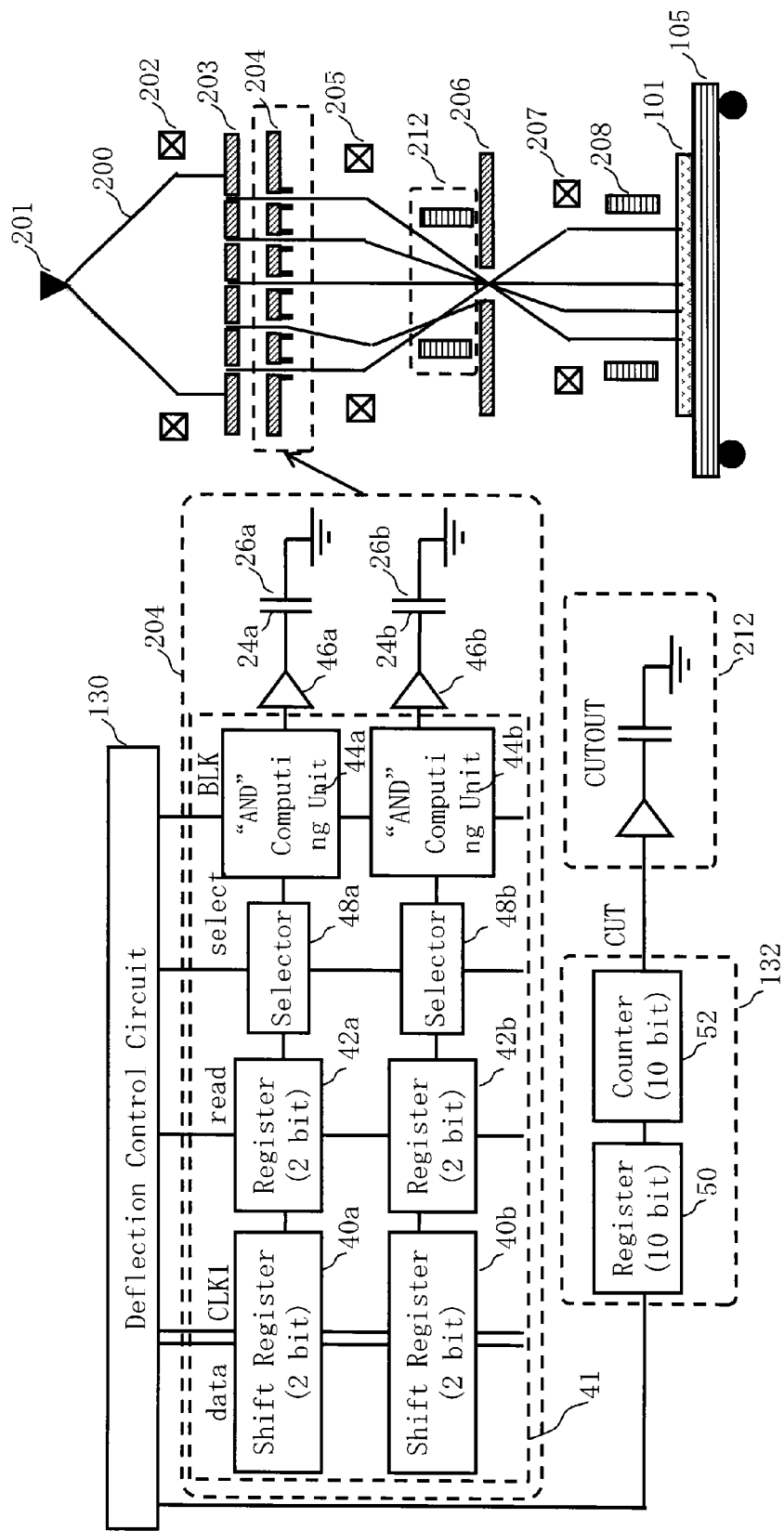
FIG. 5 is a schematic diagram showing the internal configuration of an individual blanking control circuit and a common blanking control circuit according to the first embodiment.

FIG. 5 is a schematic diagram showing the internal configuration of an individual blanking control circuit and a common blanking control circuit according to the first embodiment. In FIG. 5, a shift register 40, a register 42, a selector 48, and an AND computing unit 44 (logical product computing unit) are arranged in each logic circuit 41 for individual blanking control arranged at the blanking plate 204 in the body of the writing apparatus 100. The AND computing unit 44 may be omitted. According to the first embodiment, for example, a 2-bit control signal is used for individual blanking control for each beam, which has conventionally been controlled by, for example, a 10-bit control signal. That is, for example, a 2-bit control signal is input/output to/from the shift register 40, the register 42, the selector 48 and the AND computing unit 44. Since the amount of information of a control signal is small, an installation area of the control circuit can be small. In other words, even when a logic circuit is arranged on the blanking plate 204 whose installation space is small, more beams can be arranged at a smaller beam pitch. This enables the amount of current passing the blanking plate to be increased, and therefore, a writing throughput can be improved.

Moreover, an amplifier is arranged at the deflector 212 for common blanking, and a register 50 and a counter 52 are arranged at the logic circuit 132. These do not perform several different controlling at the same time, and therefore, it is sufficient to use one circuit to perform ON/OFF control.

Accordingly, even when arranging a circuit for a high speed response, no problem occurs with respect to the restriction on the installation space and the current to be used in the circuit. Therefore, this amplifier is operated at very high speed compared with an amplifier realizable on a blanking aperture. This amplifier is controlled by a 10-bit control signal, for example. That is, for example, a 10-bit control signal is input/output to/from the register 50 and the counter 52.

According to the first embodiment, blanking control of each beam is performed by using both the beam ON/OFF control by each logic circuit 41 for individual blanking control described above and the beam ON/OFF control by the logic circuit 132 for common blanking control that collectively control all the multiple beams.

Figure 6:
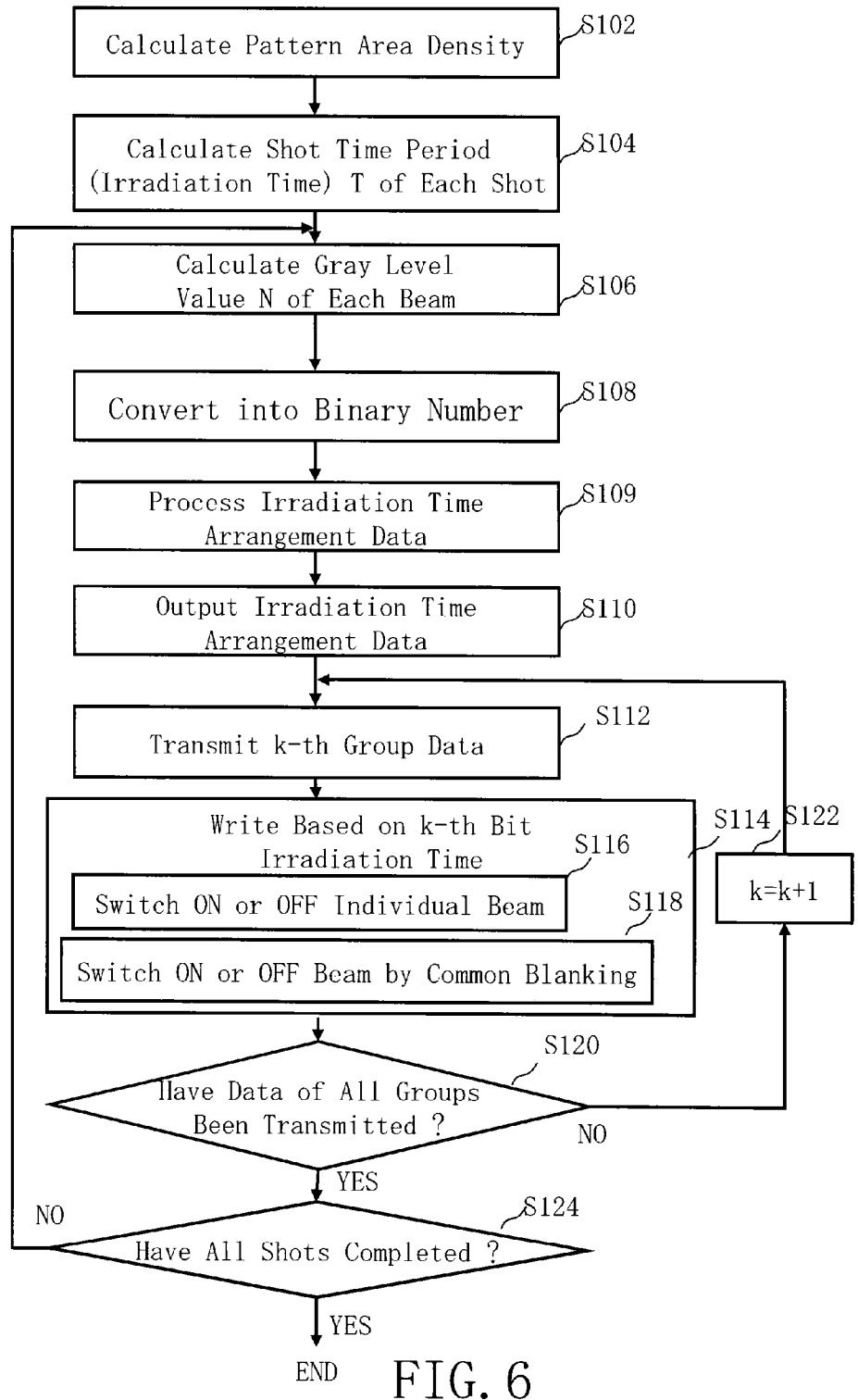
FIG. 6 is a flowchart showing main steps of a writing method according to the first embodiment.

FIG. 6 is a flowchart showing main steps of a writing method according to the first embodiment. In FIG. 6, a series of steps: a pattern area density calculation step (S102), a shot time period (irradiation time) T calculation step (S104), a gray scale value N calculation step (S106), a conversion to binary number step (S108), an irradiation time arrangement data processing step (S109), an irradiation time arrangement data output step (S110), a target group data transmission step (S112), a writing step (S114) based on irradiation time of a target group, a determination step (S120), a group change step (S122), and a determination step (S124) are executed. The writing step (S114) based on irradiation time of a target group executes, as its internal steps, a series of steps: an individual beam ON/OFF switching step (S116) and a common beam ON/OFF switching step (S118).

In the pattern area density calculation step (S102), the area density calculation unit 60 reads writing data from the storage device 140, and calculates the area density of a pattern arranged in the writing region of the target object 101 or in each mesh region of a plurality of mesh regions made by virtually dividing a chip region to be written into meshes. For example, the writing region of the target object 101 or a chip region to be written is divided into strip-shaped stripe regions each having a predetermined width. Then, each stripe region is virtually divided into a plurality of mesh regions described above. It is preferable that the size of a mesh region is, for example, a beam size, or smaller than a beam size. For example, the size of a mesh region is preferably about 10 nm. The size density calculation unit 60 reads corresponding writing data from the storage device 140 for each stripe region, and allocates a plurality of figure patterns defined in the writing data to a mesh region, for example. Then, the area density of a figure pattern arranged in each mesh region is to be calculated.

In the shot time period (irradiation time) T calculation step (S104), the irradiation time calculation unit 62 calculates an irradiation time T (which hereinafter will also be called a shot time period or an exposure time) of the electron beam per shot, for each predetermined sized mesh region. When performing multi-pass writing, an irradiation time T of the electron beam per shot in each hierarchy of multi-pass writing is to be calculated. It is preferable to obtain an irradiation time T, being a reference, to be in proportion to the area density of a calculated pattern. Moreover, it is preferable that the irradiation time T to be finally calculated is a time equivalent to a dose after correction, that is a dose having been corrected with respect to a dimension change amount for a phenomenon causing dimension variations, such as a proximity effect, a fogging effect, or a loading effect not shown. The size of a plurality of mesh regions for defining the irradiation time T and the size of a plurality of mesh regions where a pattern area density is defined may be the same size or different sizes. When they are different sizes, each irradiation time T is calculated after interpolating an area density by linear interpolation, etc. The irradiation time T for each mesh region is defined in an irradiation time map, and the irradiation time map is stored in the storage device 142, for example.

In the gray scale value N calculation step (S106), the gray scale value calculation unit 64 calculates a gray scale value N, being an integer, which is used when defining the irradiation time T for each mesh region, defined in the irradiation time map, by using a predetermined quantization unit Δ. The irradiation time T is defined by the following equation (1).

$$T = \Delta N \tag{1}$$

Therefore, the gray scale value N is defined as an integer value obtained by dividing the irradiation time T by a quantization unit Δ. The quantization unit Δ can be variously set, and, for example, can be defined by 1 ns (nanosecond), etc. It is preferable that a value of 1 to 10 ns, for example, is used as the quantization unit Δ. Δ indicates a quantization unit for controlling, such as a clock period, in the case of performing control by a counter.

In the conversion to binary number step (S108), the bit conversion unit 66 converts, for each shot of beams of multiple beams, a gray scale value N (first gray scale value) of each beam of the multiple beams, which is obtained by dividing an irradiation time (individual irradiation time period) of each of multiple beams by the quantization unit Δ, into a binary value (respective data of binary numbers) of n-digit set in advance. For example, when N=50, since it is $50=2^1+2^4+2^5$, if converting into a 10-digit binary value, it becomes "0000110010". For example, if N=500, it is "0111110100". For example, if N=700, it is "1010111100". For example, if N=1023, it is "1111111111". For each shot, the irradiation time of each beam is equivalent to an irradiation time defined for a mesh region to be irradiated by each beam concerned. Thereby, the irradiation time T is defined by the following equation (2).

$$T = \Delta \sum_{k=0}^{n-1} a_k 2^k \tag{2}$$

$a_k$ indicates a value (1 or 0) of each digit in the case defining the gray scale value N by a binary number. Although it is sufficient for n, being the number of digits, to be two or more, preferably it should be four or more digits, and more preferably, it should be eight or more digits.

According to the first embodiment, for each shot of beams, irradiation of each beam of each shot of beams concerned is divided into irradiation steps of "n" times, "n" being the number of digits of a binary number sequence (data of binary numbers) set in advance. The irradiation steps of n times is equivalent to a combination of irradiation of irradiation time periods (plurality of first irradiation time periods). A maximum irradiation time period per shot of beams of the multiple beams is divided into a plurality, being the digit number "n", of the irradiation time periods (plurality of first irradiation time periods). Each of the irradiation time periods (plurality of first irradiation time periods) is calculated by multiplying a corresponding gray scale value (second gray scale value) of a plurality of gray scale values (plurality of second gray scale values) by Δ, where the plurality of gray scale values (plurality of second gray scale values) are gray scale values defined in decimal numbers converted from each digit value of a binary value (data of binary numbers) of n-digit. In other words, one shot of a beam is divided into a plurality of irradiation steps of irradiation time periods of $\Delta a_0 2^0$, $\Delta a_1 2^1, \ldots, \Delta a_k 2^k, \ldots, \Delta a_{n-1} 2^{n-1}$. In the case of n=10, n being the number of digits, one shot is divided into ten irradiation steps.

FIG. 7 shows a bit processing table representing a relation between each digit number and an irradiation time of each digit in the case of the digit number n=10 according to the first embodiment. In FIG. 7, the irradiation time of the first digit (k=0) (the first bit) is $\Delta$, the irradiation time of the second digit (k=1) (the second bit) is $2\Delta$, the irradiation time of the third digit (k=2) (the third bit) is $4\Delta$, the irradiation time of the fourth digit (k=3) (the fourth bit) is $8\Delta, \ldots$, and the irradiation time of the tenth digit (k=9) (the tenth bit) is $512\Delta$.

For example, in the case of the digit number n being 10 (n=10), if N=70, the irradiation time of the tenth digit (the tenth bit) is $\Delta \times 512$. The irradiation time of the ninth digit (the ninth bit) is $\Delta \times 0 = 0$. The irradiation time of the eighth digit (the eighth bit) is $\Delta \times 128$. The irradiation time of the seventh digit (the seventh bit) is $\Delta \times 0 = 0$. The irradiation time of the sixth digit (the sixth bit) is $\Delta \times 32$. The irradiation time of the fifth digit (the fifth bit) is $\Delta \times 16$. The irradiation time of the fourth digit (the fourth bit) is $\Delta \times 8$. The irradiation time of the third digit (the third bit) is $\Delta \times 4$. The irradiation time of the second digit (the second bit) is $\Delta \times 0 = 0$. The irradiation time of the first digit (the first bit) is $\Delta \times 0 = 0$. The total time of these is $700\Delta$.

For example, in the case of performing irradiation in order from the largest digit to the smallest digit, if $\Delta = 1$ ns, the first irradiation step is irradiation of 512 ns (beam ON). The second irradiation step is irradiation of 0 ns (beam OFF). The third irradiation step is irradiation of 128 ns (beam ON). The fourth irradiation step is irradiation of 0 ns (beam OFF). The fifth irradiation step is irradiation of 32 ns (beam ON). The sixth irradiation step is irradiation of 16 ns (beam ON). The seventh irradiation step is irradiation of 8 ns (beam ON). The eighth irradiation step is irradiation of 4 ns (beam ON). The ninth irradiation step is irradiation of 0 ns (beam OFF). The tenth irradiation step is irradiation of 0 ns (beam OFF).

There has been described the case of transmitting data for "n" irradiation steps in order of the amount of data from the largest, for example. The time for data transmission can be included in the irradiation time of an irradiation step by performing in parallel the transmission of data indicating ON/OFF of the (k−1)th bit (the (k−1)th digit)) of each beam with the irradiation step of the k-th bit (the k-th digit) of each beam. However, if k becomes small, since the irradiation time of an irradiation step becomes short, it is difficult to include the transmission of data indicating ON/OFF of the (k−1)th bit (the (k−1)th digit)) in the irradiation time of the irradiation step. Then, a digit whose irradiation time is long and a digit whose irradiation time is short are grouped. Thereby, the data transmission time of the next group can be included in the total of grouped irradiation time in the irradiation step.

FIG. 8 shows a grouped exposure table according to a comparative example of the first embodiment. FIG. 8 shows the case of n=10 similarly to FIG. 7. In the example of FIG. 8, in order that the difference between the totals of grouped irradiation time may become smaller to be close to uniform, configuration is performed as follows. As the exposure step 1, the group 1 is composed of the first digit (k=0) (the first bit) and the tenth digit (k=9) (the tenth bit) of the bit processing table of FIG. 7. As the exposure step 2, the group 2 is composed of the second digit (k=1) (the second bit) and the ninth digit (k=8) (the ninth bit). As the exposure step 3, the group 3 is composed of the third digit (k=2) (the third bit) and the eighth digit (k=7) (the eighth bit). As the exposure step 4, the group 4 is composed of the fourth digit (k=3) (the fourth bit) and the seventh digit (k=6) (the seventh bit). As the exposure step 5, the group 5 is composed of the fifth digit (k=4) (the fifth bit) and the sixth digit (k=5) (the sixth bit). Thus, as described above, by dividing the irradiation time into five groups, the difference between the totals of the grouped irradiation time can be small compared with the case of no grouping. However, as shown in FIG. 8, the total of the irradiation time of the group 1 shown as the exposure step 1 is $513\Delta$, whereas, the total of the irradiation time of the group 5 shown as the exposure step 5 is $48\Delta$. Thus, there is a difference of ten times or more between the totals of the exposure time (irradiation time) of the exposure steps, which means that there still exists a large difference. For example, in the case of the total of the irradiation time of the group 5 shown as the exposure step 5 being $48\Delta$, it is necessary to increase the operation clock of the shift register 40 so that data transmission of the group to be exposed next may be completed within while the irradiation of the group 5 shown as the exposure step 5 is being performed. Then, according to the first embodiment, irradiation time of some digits of the bit processing table shown in FIG. 7 is divided further.

Figure 9A:
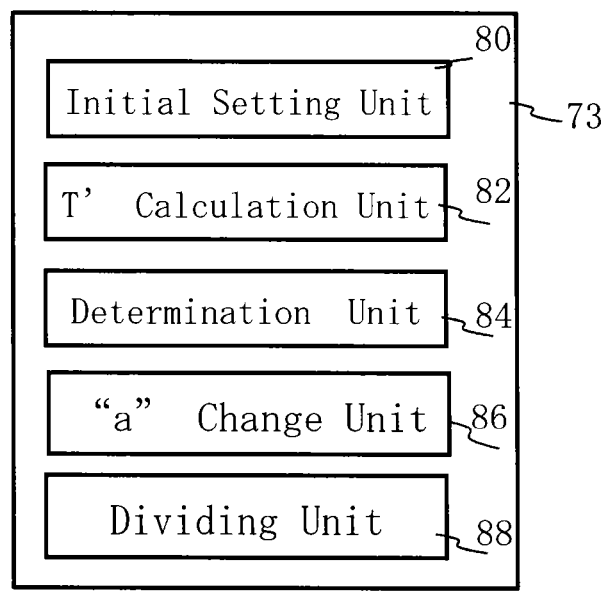
FIGS. 9A and 9B show internal configuration of the bit processing table generation unit and the exposure table generation unit according to the first embodiment.
Figure 9B:
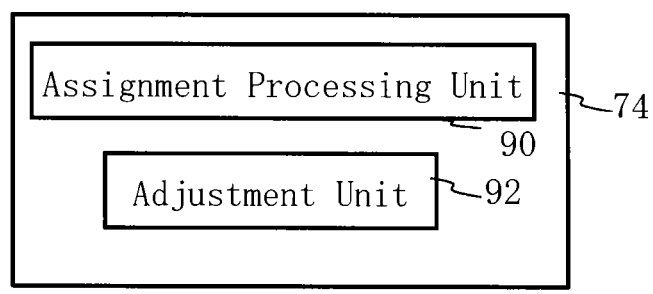

FIGS. 9A and 9B show internal configuration of the bit processing table generation unit and the exposure table generation unit according to the first embodiment. As shown in FIG. 9A, in the bit processing table generation unit 73, there are arranged an initial setting unit 80, a reference irradiation time T' calculation unit 82, a determination unit 84, an irradiation time increase number "a" change unit 86, and a dividing unit 88. As shown in FIG. 9B, in the exposure table generation unit 74, there are arranged an assignment processing unit 90 and an adjustment unit 92. Each function, such as the initial setting unit 80, the reference irradiation time T' calculation unit 82, the determination unit 84, the irradiation time increase number "a" change unit 86, the dividing unit 88, the assignment processing unit 90 and the adjustment unit 92 may be configured by hardware such as an electronic circuit or by software such as a program causing a computer to implement these functions. Alternatively, it may be configured by a combination of hardware and software. Data which is input and output to/from the initial setting unit 80, the reference irradiation time T' calculation unit 82, the determination unit 84, the irradiation time increase number "a" change unit 86, the dividing unit 88, the assignment processing unit 90 and the adjustment unit 92 and data being calculated are stored in the memory 112 each time.

Figure 10:
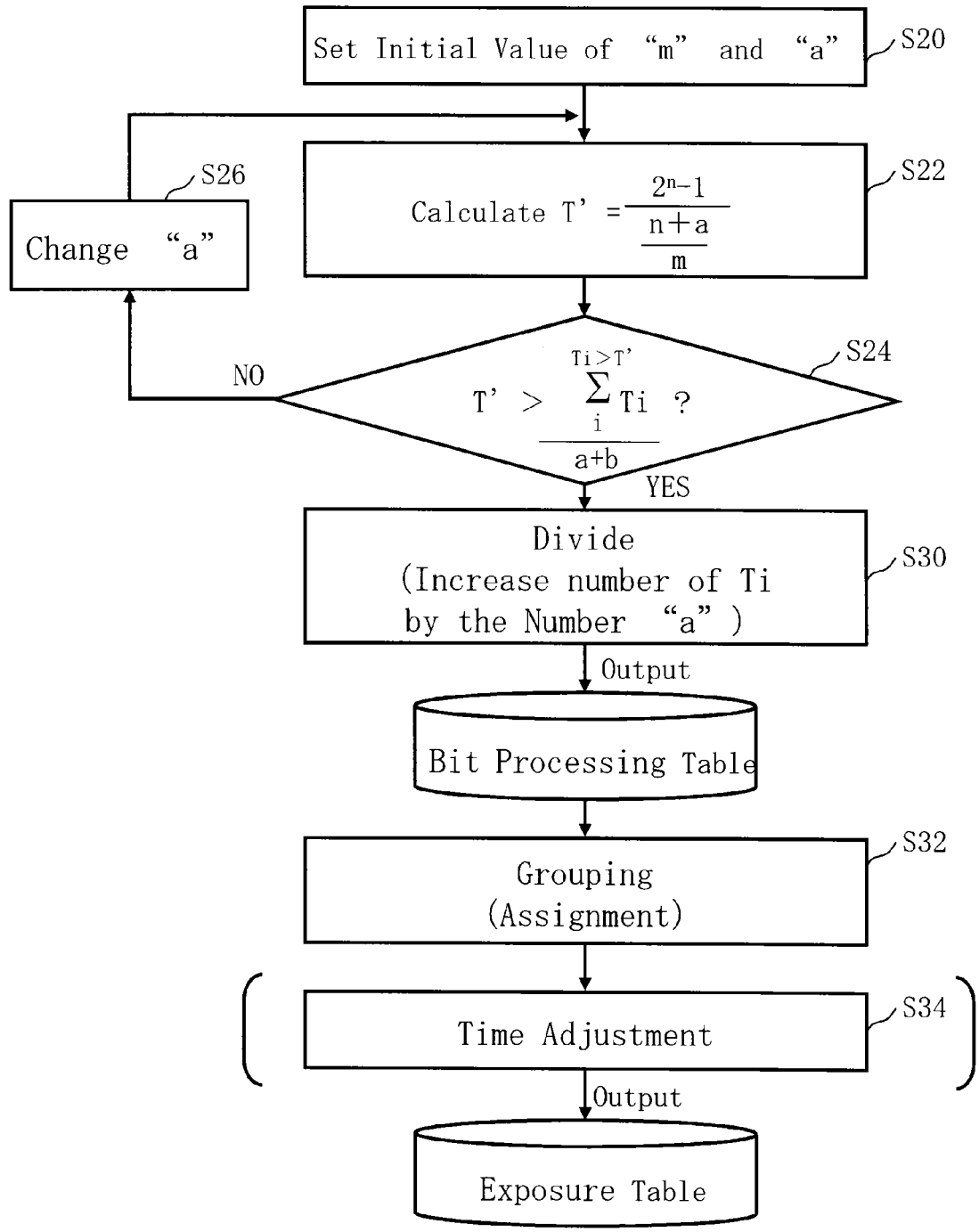
FIG. 10 is a flowchart showing a generation method of a bit processing table and an exposure table according to the first embodiment.

FIG. 10 is a flowchart showing a generation method of a bit processing table and an exposure table according to the first embodiment. In FIG. 10, the generation method of a bit processing table and an exposure table executes a series of steps: an initial setting step (S20), a reference irradiation time T' calculation step (S22), a determination step (S24), an irradiation time increase number "a" change step (S26), a dividing step (S30), a grouping processing step (S32), and a time adjustment step (S34). The time adjustment step (S34) may be omitted.

The bit processing table generation unit 73 generates a bit processing table showing a relation between a place value "k" of bit data and an irradiation time corresponding to the place value "k" by the following calculation procedure. A maximum irradiation time per shot of beams of the multiple beams is divided into "n" number of plurality of irradiation time periods (first irradiation time periods). Each of the irradiation time periods (plurality of first irradiation time periods) is calculated by multiplying a corresponding gray scale value (second gray scale value) of a plurality of gray scale values (plurality of second gray scale values) by $\Delta$, where the plurality of gray scale values (plurality of second gray scale values) are gray scale values defined in decimal numbers converted from each digit value of a binary value (data of binary numbers) of n-digit. Then, a part (second irradiation time periods), being a number "b", of the "n" plurality of irradiation time periods is further divided into a plurality of irradiation time periods (third irradiation time periods). Then, divided (a+b) plurality of irradiation time periods (third irradiation time periods), "a" being explained below, and the remaining undivided (n−b) plurality of irradiation time periods (first irradiation time periods) are used for generating a bit processing table.

In the initial setting step (S20), the initial setting unit 80 sets an initial value for each of a combination number "m" and an increased number "a" of irradiation time periods (an irradiation time increased number "a"), wherein the increased number "a" of irradiation time periods indicates that the number of irradiation time periods is increased by "a". Since 1 bit is necessary for irradiation time arrangement data of the irradiation step of each digit, for example, if when configuring data transmission by 2-bit data, since it becomes combination (grouping) of irradiation steps of two digits, the combination number "m" is two (m=2). For example, if when configuring data transmission by 3-bit data, since it becomes combination (grouping) of irradiation steps of three digits, the combination number "m" is three (m=3). For example, if when configuring data transmission by 4-bit data, since it becomes combination (grouping) of irradiation steps of four digits, the combination number "m" is four (m=4). Here, for example, it is supposed that "m" is two (m=2). For example, in the list shown in FIG. 7, the irradiation time is divided into ten irradiation time periods, where ten is the number of digits whose place values "k" are 0 to 9. For example, if dividing two of the ten irradiation time periods into four, since two irradiation time periods become four irradiation time periods, the ten-digit number irradiation time periods become twelve irradiation time periods totally, and thus, the irradiation time increased number "a" is two (a=2). For example, if dividing two of the ten irradiation time periods into six, since two irradiation time periods become six irradiation time periods, the ten-digit irradiation time periods become fourteen irradiation time periods totally, and thus, the irradiation time increased number "a" is four (a=4). In this case, it is supposed that "a" is two (a=2).

In the reference irradiation time T' calculation step (S22), the reference irradiation time T' calculation unit 82 calculates a reference irradiation time T' by solving the following equation (3), using the combination number "m", the digit number "n", the irradiation time increased number "a" and the quantization unit Δ.

$$T' = \frac{(2^n - 1)}{(n+a)/m} \Delta \qquad (3)$$

For example, in the case of n=10, m=2, and a=2, the reference irradiation time T'=170.5Δ (=1023Δ/{(10+2)/2}). Then, it is determined whether the calculated reference irradiation time T' is appropriate or not.

In the determination step (S24), the determination unit 84 determines whether the calculated reference irradiation time T' satisfies the following equation (4) or not, by using the irradiation time increased number "a", the irradiation time Ti (first irradiation time period) of the i-th digit of the binary number in "n" irradiation time periods (first irradiation time periods), where "n" being the number of digits, and "b" being the number of irradiation time periods to be divided as a part of the "n" irradiation time periods (first irradiation time periods).

$$T' > \frac{\sum_{i}^{T_i > T'} T_i}{a+b} \qquad (4)$$

For example, in the case of n=10, m=2, a=2, and the reference irradiation time T'=170.5Δ in the bit table of FIG. 7, with respect to the irradiation time period Ti that exceeds 170.5Δ, there are two 256Δ and 512Δ. According to the first embodiment, irradiation time periods exceeding the reference irradiation time T' are dividing targets. Therefore, "b", which is the number of irradiation time periods (second irradiation time periods) to be divided, as a part of the "n" irradiation time periods (first irradiation time periods) is calculated to be two (b=2). Accordingly, the right-hand side of the equation (4) is calculated to be (256+512)/(2+2)=192, which does not satisfy the equation (4). When the calculated reference irradiation time T' does not satisfy the equation (4), it proceeds to the irradiation time increase number "a" change step (S26).

In the irradiation time increase number "a" change step (S26), the irradiation time increase number "a" change unit 86 changes an increased number "a" of irradiation time periods. Here, it is changed to a=4, for example. Then, it returns to the reference irradiation time T' calculation step (S22). Then, in the determination step (S24), each of the steps from the reference irradiation time T' calculation step (S22) to the irradiation time increase number "a" change step (S26) is repeated until the calculated reference irradiation time T' satisfies the equation (4).

In the reference irradiation time T' calculation step (S22) after the increased number "a" of irradiation time periods has been changed to a=4, for example, the equation (3) is calculated similarly. For example, in the case of n=10, m=2, and a=4, the reference irradiation time is T'=146.1Δ. Next, it is determined whether the calculated reference irradiation time T'=146.1Δ is appropriate or not. In the determination step (S24), with respect to the irradiation time period that exceeds 146.1Δ, there are two 256Δ and 512Δ. Therefore, "b" is two (b=2). However, since a=4, the right-hand side of the equation (4) is calculated to be (256+512)/(4+2)=128. Therefore, the calculated reference irradiation time T'=146.1Δ satisfies the equation (4). Accordingly, the reference irradiation time T'=146.1Δ is appropriate, and, in this regard, the number "b" of the irradiation time periods to be divided is two (b=2), and the irradiation time increase number "a" is four (a=4). As described above, the reference irradiation time T', and the number "b" of irradiation time periods to be divided and the increased number "a" of irradiation time periods, concerning this reference irradiation time T', are calculated. In the determination step (S24), when the calculated reference irradiation time T' satisfies the equation (4), it proceeds to the dividing step (S30).

In the dividing step (S30), with respect to the "n" irradiation time periods (first irradiation time periods), "n" being the number of digits, the dividing unit 88 divides "b" irradiation time periods Ti (second irradiation time periods), each of which is greater than the reference irradiation time T', into a plurality of irradiation time periods (third irradiation time periods) so that the number of a plurality of irradiation time periods (first irradiation time periods) may be increased by "a". Specifically, for example, in the above-described case of n=10, m=2, a=4, b=2, and T'=146.1Δ, there are two irradiation time periods Ti, namely 256Δ and 512Δ. Therefore, the two irradiation time periods, 256Δ and 512Δ, are divided into six (a+b) irradiation time periods. In that case, it is preferable to use the irradiation time of the i-th digit of the binary digit which is the closest to the reference irradiation time T', as an object of the irradiation time to be divided. Here, 128Δ is the closest to T'=146.1Δ. Therefore, the two irradiation time periods 256Δ and 512Δ are divided into six irradiation time periods each being 128Δ.

FIG. 11 shows a bit processing table representing a relation between each digit number and an irradiation time of each digit, after the dividing, in the case of the digit number n=10 according to the first embodiment. In FIG. 11, the irradiation time from the first digit (k=0) (the first bit) to the eighth digit (k=7) (the eighth bit) are the same as those in FIG. 7. In FIG. 11, the ninth digit (k=8) (the ninth bit) is divided into k=8a and k=8b, the irradiation time of each of which is made to be 128Δ. The tenth digit (k=9) (the tenth bit) is divided into k=9a, 9b, 9c, and 9d, the irradiation time of each of which is made to be 128Δ. Thus, combination of fourteen (n+a) irradiation time periods is totally obtained.

As described above, the bit processing table generation unit 73 generates a bit processing table which is for generating (n+a)-digit binary number data to define an irradiation time per shot. The generated bit processing table is stored in the storage device 144. The ON/OFF data of irradiation time after the dividing is configured so that the ON/OFF data of irradiation time before dividing may be succeeded. That is, for example, if the ON/OFF data of the irradiation time of the tenth digit (the tenth bit) is ON, the ON/OFF data of the irradiation time of the divided k=9a, 9b, 9c and 9d is also to be ON. If the ON/OFF data of the irradiation time of the ninth (the ninth bit) is ON, the ON/OFF data of the irradiation time of the divided k=8a and k=8b is also to be ON. Thereby, even if the dividing is performed, the total of the irradiation time per shot can be the same. The bit processing table should be generated before starting writing processing.

By the procedure described above, "n" irradiation time periods, "n" being the digit number, are regenerated to be (n+a) irradiation time periods. In other words, one shot is redivided into (n+a) irradiation steps from "n" irradiation steps.

Next, the exposure table generation unit 74 generates a grouped exposure table by assigning each irradiation time of the generated bit processing table to one of a plurality of groups (irradiation time group) which is composed a combination of at least two irradiation time periods.

In the grouping processing step (S32), for each shot of beams, the assignment processing unit 90 performs assignment by the following calculation procedure. As mentioned above, a maximum irradiation time period per shot of beams of the multiple beams is divided into "n" irradiation time periods (a plurality of first irradiation time periods). Each of the "n" irradiation time periods is calculated by multiplying a corresponding gray scale value (second gray scale value) of a plurality of gray scale values (plurality of second gray scale values) by Δ, where the plurality of gray scale values (plurality of second gray scale values) are gray scale values defined in decimal numbers converted from each digit value of a binary value (data of binary numbers) of n-digit. Further, "b" irradiation time periods (plurality of second irradiation time periods), which are a part of the "n" irradiation time periods, are divided into "(b+a)" irradiation time periods (plurality of third irradiation time periods). The assignment processing unit 90 assigns the plurality of irradiation time periods (third irradiation time periods) and the remaining undivided irradiation time periods (first irradiation time periods) to one of a plurality of irradiation time groups which is composed a combination of at least two irradiation time periods. Specifically, the assignment is performed as follows. The assignment processing unit 90 assigns the divided irradiation time periods (third irradiation time periods) and the remaining undivided irradiation time periods (first irradiation time periods) to one of a plurality of groups so that the total irradiation time of each group may further be close to the reference irradiation time T'. Here, combination of a smaller (shorter) irradiation time and a larger (longer) irradiation time is assigned in order.

In other word, irradiation of each beam of the multiple charged particle beams is divided into first irradiation steps of the divided irradiation time periods and second irradiation steps of the remaining undivided irradiation time periods, and a plurality of groups are respectively composed of combination of at least two irradiation steps of the first irradiation steps and the second irradiation steps for each beam of each shot of beams.

FIG. 12 shows a grouped exposure table according to the first embodiment. Similarly to FIG. 11, FIG. 12 shows the case where the irradiation time (exposure time) is divided into fourteen irradiation time periods. In the example of FIG. 12, in order that the difference between totals of grouped irradiation time may become smaller to be close to uniform, configuration is performed as follows. As the exposure step 1, the group 1 is configured by the first digit (k=0) (the first bit) and the fourteenth digit (the fourteenth bit) which is a division (k=9d) of the tenth digit (the tenth bit) in the bit processing table of FIG. 11. As the exposure step 2, the group 2 is configured by the second digit (k=1) (the second bit) and the thirteenth digit (the thirteenth bit) which is a division (k=9c) of the tenth digit (the tenth bit). As the exposure step 3, the group 3 is configured by the third digit (k=2) (the third bit) and the twelfth digit (the twelfth bit) which is a division (k=9b) of the tenth digit (the tenth bit). As the exposure step 4, the group 4 is configured by the fourth digit (k=3) (the fourth bit) and the eleventh digit (the eleventh bit) which is a division (k=9a) of the tenth digit (the tenth bit). As the exposure step 5, the group 5 is configured by the fifth digit (k=4) (the fifth bit) and the tenth digit (the tenth bit) which is a division (k=8b) of the ninth digit (the ninth bit). As the exposure step 6, the group 6 is configured by the sixth digit (k=5) (the sixth bit) and the ninth digit (the ninth bit) which is a division (k=8a) of the ninth digit (the ninth bit). As the exposure step 7, the group 7 is configured by the seventh digit (k=6) (the seventh bit) and the eighth digit (k=7) (the eighth bit). Thus, by dividing into seven groups, the difference between the totals of the irradiation time of the groups can be small compared with the case of the five groups of FIG. 8. In the comparison example of FIG. 8, there is a difference of ten times or more between the totals of the exposure time (irradiation time) of exposure steps. On the other hand, according to the first embodiment, as shown in FIG. 12, the total of the irradiation time of the group 1 shown as the exposure step 1 is 129Δ, whereas the total of the irradiation time of the group 7 shown as the exposure step 7 is 192Δ. Thus, the difference of the total of exposure time (irradiation time) can be reduced to 1.49 times between exposure steps. Accordingly, when performing data transmission processing of the group 1 shown as the exposure step 1 whose irradiation time is the shortest, it is sufficient just to increase the operation clock of the shift register 40 to be one and a half times, and thus, it is unnecessary to increase it to be ten times as described in the comparative example of FIG. 8.

The grouped exposure table generated as described above is stored in the storage device 144. The exposure table should be generated before starting writing processing. Although, in the example described above, the grouped exposure table is generated in the writing apparatus 100, it is not limited thereto. If the digit number "n" which is used when converting the irradiation time per shot into binary number data has been previously set, the grouped exposure table itself can also be set beforehand. Therefore, it is also preferable to generate a grouped exposure table outside the apparatus in advance, and to input it to the writing apparatus 100 to be stored in the storage device 144. In other words, it is also preferable to prepare the bit processing table generation unit shown in FIGS. 9A and 9B, as an external device.

If further reducing the difference between totals of the exposure time (the irradiation time) of exposure steps, what is necessary is just to execute the time adjustment step (S34). In addition, the time adjustment step (S34) may be omitted.

In the time adjustment step (S34), in order to make the difference between the total irradiation time periods of a plurality of groups be closer to each other, the adjustment unit 92 divides partial irradiation time of each irradiation time configuring some groups of a plurality of groups into a plurality of irradiation time periods (fourth irradiation time periods), and assigns one irradiation time period of the plurality of irradiation time periods (fourth irradiation time periods) to other group. In order to make the total irradiation time of each group be closer to the reference irradiation time T', the adjustment unit 92 divides partial irradiation time of each irradiation time configuring some groups into a plurality of irradiation time periods (fourth irradiation time periods), and assigns one irradiation time period of the plurality of irradiation time periods (fourth irradiation time periods) to other group.

FIG. 13 shows an example of a grouped exposure table after the adjustment according to the first embodiment. In FIG. 13, a part of irradiation time of a group whose total irradiation time is the largest is divided. In the example of FIG. 12, the largest of the total irradiation time is 192Δ of the group 7 shown as the exposure step 7. The reference irradiation time T' in this example is T'=146.1Δ. Therefore, the difference between them is about 46Δ. Accordingly, it is desired to make the total of the irradiation time of the group 7 shown as the exposure step 7 be 146Δ. However, the group 7 shown as the exposure step 7 is composed of the irradiation time 64Δ of the seventh digit (k=6) (the seventh bit) and the irradiation time 128Δ of the eighth digit (k=7) (the eighth bit), and therefore, is not a dividing target irradiation time to be divided. If dividing is performed for an irradiation time other than a dividing target irradiation time to be divided, b=2 described above cannot be obtained. Then, according to the first embodiment, adjustment is performed using a dividing target irradiation time. Specifically, for example, in the case of n=10, m=2, a=4, b=2, and T'=146.1Δ as described above, the number of exposure steps (the number of groups) is seven as described above. Therefore, seven irradiation time periods in order from the smallest are separately assigned to respective exposure steps (groups) in order to increase possibility of making each of the seven irradiation time periods and any one of irradiation time periods divided from at least one dividing target irradiation time be respectively included in a same step of the exposure steps (groups).

Next, the adjustment unit 92 calculates a combination to be closer to the reference irradiation time T'=146.1Δ in the case of combining irradiation time periods which are not dividing targets. Since the remaining irradiation time not being a dividing target is the eighth digit (k=7) (the eighth bit) irradiation time 128Δ, it is possible to obtained the total of irradiation time 144Δ by combining it with 16Δ of the exposure step 5 (the group 5) in FIG. 13. Next, with respect to the group 7 shown as the exposure step 7 whose total of irradiation time is 192Δ was the maximum in the case of FIG. 12, since the irradiation time 64Δ of the seventh digit (k=6) (the seventh bit) has already been assigned, the remaining 82Δ is obtained by dividing the irradiation time 128Δ of the division (k=9d) of the tenth digit (the tenth bit) into 82Δ and 46Δ, and then assigning the 82Δ. Thereby, the total of the irradiation time of the group 7 shown as the exposure step 7 can be 146Δ. Next, the group 1 is configured by the first digit (k=0) (the first bit) and the division (k=9a) of the tenth digit (the tenth bit). As the exposure step 2, the group 2 is configured by the second digit (k=1) (the second bit) and the division (k=9b) of the tenth digit (the tenth bit). As the exposure step 3, the group 3 is configured by the third digit (k=2) (the third bit) and the division (k=9c) of the tenth (tenth bit). Since k=0 is Δ, k=1 is 2Δ, and k=2 is 4Δ, they are all small. Then, the remaining 46Δ of the divided k=9d is divided into 16 Δ, 16Δ, and 14Δ, and assigned to the irradiation time of k=9a, 9b and 9c. Thereby, with respect to the group 1 shown as the exposure step 1, the total of the irradiation time can be 145Δ. With respect to the group 2 shown as the exposure step 2, the total of the irradiation time can be 146Δ. With respect to the group 3 shown as the exposure step 3, the total of the irradiation time can be 146Δ.

After the processing described above, remaining groups are the group 4 shown as the exposure step 4 and the group 6 shown as the exposure step 6. As the exposure step 4, the group 4 is configured by the fourth digit (k=3) (the fourth bit) and the division (k=8a) of the ninth digit (the ninth bit). As the exposure step 6, the group 6 is configured by the sixth digit (k=5) (the fifth bit) and the division (k=8b) of the ninth bit (the ninth bit). Here, with respect to the group 4 shown as the exposure step 4, since the irradiation time 8Δ of the fourth digit (k=3) (the fourth bit) and 128Δ of k=8a have been assigned, it is necessary to add 10Δ. On the other hand, with respect to the group 6 shown as the exposure step 6, since the irradiation time 32Δ of the sixth digit (k=5) (the sixth bit) and 128Δ of k=8b have been assigned, 14Δ is superfluous. Then, 128Δ of k=8b is divided into 118Δ and 10Δ. 118Δ is assigned to t8b of the group 6 shown as the exposure step 6, and 10Δ is assigned to t8a of the group 4 shown as the exposure step 4. Thereby, the total of the irradiation time of the group 4 shown as the exposure step 4 can be 146Δ. The total of the irradiation time the group 6 shown as the exposure step 6 can be 150Δ. As described above, by performing the time adjustment step (S34), the respective total irradiation time periods of a plurality of groups can be closer to each other. In addition, the ON/OFF data of the irradiation time after the adjustment is configured so that the ON/OFF data of the irradiation time before dividing may be succeeded. Therefore, it is impossible to make an element of an exposure table by using each element of the bit processing table before dividing or what is divided from that element, by adding it to other element or to what is divided from the other elements.

The adjusted exposure table generated as described above is stored in the storage device 144. The adjusted exposure table should be generated before starting writing processing. Although, in the example described above, the adjusted exposure table is generated in the writing apparatus 100, it is not limited thereto. If the digit number "n" which is used when converting the irradiation time per shot into binary number data has been previously set, the adjusted exposure table itself can also be set beforehand. Therefore, it is also preferable to generate an adjusted exposure table outside the apparatus in advance, and to input it to the writing apparatus 100 to be stored in the storage device 144.

In the irradiation time arrangement data processing step (S109), referring to the bit processing table stored in the storage device 144, the bit processing unit 70 converts n-digit binary number data, which was converted in the binary digit conversion step (S108), into (n+a)-digit binary number data. For example, in the case of the bit processing table of FIG. 11, 10-digit binary number data is converted to 14-digit binary number data. For example, if N=5Δ, ten digits "0000110010" is converted to fourteen digits "00000000110010". For example, if N=500, similarly, ten digits "0111110100" is converted to fourteen digits "00001111110100". In that case, since the ninth digit of the ten-digit binary number data is "1" and the tenth digit of it is "0", the ninth digit and the tenth digit, (8a and 8b), of the fourteen digits after processing are "1", and the eleventh digit to the fourteenth digit, (9a, 9b, 9c, and 9d), are "0". For example, if N=700, similarly, ten digits "1010111100" is converted to fourteen digits "11110010111100". For example, if N=1023, similarly, ten digits "1111111111" is converted to fourteen digits "11111111111111".

In the irradiation time arrangement data output step (S110), the transmission processing unit 68 outputs, for each beam shot, irradiation time arrangement data having been converted to (n+a)-digit binary number data, to the deflection control circuit 130. In that case, referring to the grouped exposure table stored in the storage device 144, the transmission processing unit 68 outputs, for each group, irradiation time arrangement data to the deflection control circuit 130.

In the target group data transmission step (S112), the deflection control circuit 130 outputs, for each shot, irradiation time arrangement data of each group to the logic circuit 41 for each beam. Moreover, synchronized with this, the deflection control circuit 130 outputs timing data of each irradiation step to the logic circuit 132 for common blanking.

Since the shift register 40 is used for the logic circuit 41 as shown in FIG. 5 in the first embodiment, the deflection control circuit 130 transmits data of each bit (the same digit number) configuring the same group to each logic circuit 41 of the blanking plate 204 in the order of beam arrangement (or in the order of identification number). Moreover, a clock signal (CLK1) for synchronization, a read signal (read) for data read-out, and an adder signal (BLK) are output. For example, as the data of the $k_1$-th bit (the $k_1$-th digit) and the $k_2$-th bit (the $k_2$-th digit) that configure the k-th group of the beam 1, two bits "11" are generated. As the data of the $k_1$-th bit (the $k_1$-th digit) and the $k_2$-th bit (the $k_2$-th digit) that configure the k-th group of the beam 2, two bits "11" are generated. As the data of the $k_1$-th bit (the $k_1$-th digit) and the $k_2$-th bit (the $k_2$-th digit) that configure the k-th group of the beam 3, two bits "00" are generated. As the data of the $k_1$-th bit (the $k_1$-th digit) and the $k_2$-th bit (the $k_2$-th digit) that configure the k-th group of the beam 4, two bits "11" are generated. As the data of the $k_1$-th bit (the $k_1$-th digit) and the $k_2$-th bit (the $k_2$-th digit) that configure the k-th group of the beam 5, two bits "00" are generated. From the end beam side, the deflection control circuit 130 transmits each 2-bit data of "0011001111". Then, from the upper side shift register to the next one, the shift register 40 of each beam transmits data in order, two bits by two bits, according to a clock signal (CLK1). For example, with respect to the data of the k-th group of the beams 1 to 5, by five clock signals, 2-bit data "11" is stored in the shift register 40 of the beam 1, 2-bit data "11" is stored in the shift register 40 of the beam 2, 2-bit data "00" is stored in the shift register 40 of the beam 3, 2-bit data "11" is stored in the shift register 40 of the beam 4, and 2-bit data "00" is stored in the shift register 40 of the beam 5.

Next, when inputting a read signal (read), the register 42 of each beam reads in the k-th group data of each beam from the shift register 40. In the example described above, as the data of the k-th group, 2-bit data "11" is stored in the register 42 of the beam 1, 2-bit data "11" is stored in the register 42 of the beam 2, 2-bit data "00" is stored in the register 42 of the beam 3, 2-bit data "11" is stored in the register 42 of the beam 4, and 2-bit data "00" is stored in the register 42 of the beam 5. When inputting the data of the k-th group, the individual register 42 of each beam outputs, according to the data, an ON/OFF signal to the AND computing unit 44 through the selector 48. In the first embodiment, the output of the individual register 42 is switched from the output of the $k_1$-th bit (the $k_1$-th digit) to the output of the $k_2$-th bit (the $k_2$-th digit) by switching the selector 48.

When the selector 48 inputs a select signal (select), one is switched to the other in the 2-bit signal. If the BLK signal is an ON signal and the signal of the register 42 is ON, the AND computing unit 44 outputs an ON signal to the amplifier 46, and then, the amplifier 46 applies an ON voltage to the electrode 24 of the individual blanking deflector. In other case, the AND computing unit 44 outputs an OFF signal to amplifier 46, and then, the amplifier 46 applies an OFF voltage to the electrode 24 of the individual blanking deflector.

While the 2-bit data of the k-th group is being processed, the deflection control circuit 130 transmits the data of the next (k+1)th group to each logic circuit 41 of the blanking plate 204, in the order of beam arrangement (or in the order of identification number). Hereafter, it should similarly proceed to the data processing of the last group.

The AND computing unit 44 shown in FIG. 5 may be omitted. However, it is effective in that a beam can be controlled to be OFF by the AND computing unit 44 in the case of not being able to make the beam OFF because of a trouble of one of elements of the logic circuit 41.

In the writing step (S114) according to irradiation time of a target group, writing is performed, for each beam shot, based on irradiation time of each irradiation step of a target group, in irradiation divided into a plurality of irradiation steps of a plurality of groups.

Figure 14:
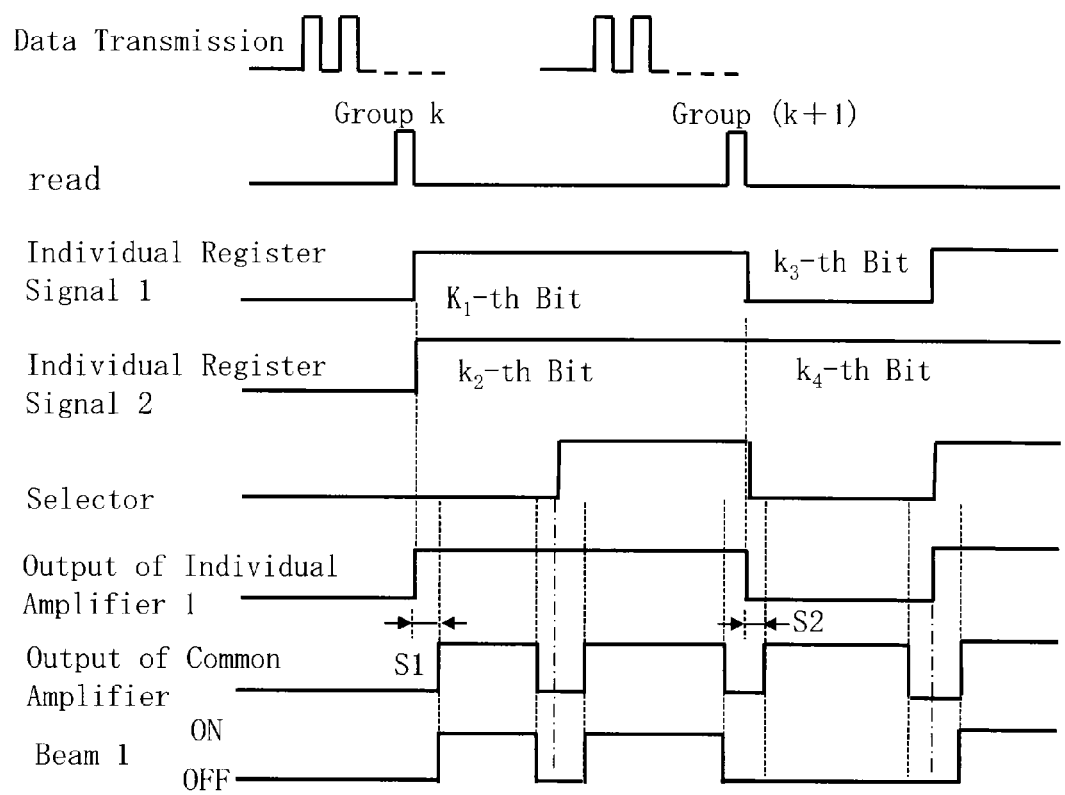
FIG. 14 is a timing chart showing a beam ON/OFF switching operation with respect to a part of an irradiation step in one shot according to the first embodiment.

FIG. 14 is a timing chart showing a beam ON/OFF switching operation with respect to a part of an irradiation step in one shot according to the first embodiment. FIG. 14 shows one beam (beam 1) in a plurality of beams that configure a multi-beam. Here, for example, there are shown irradiation steps from the k group composed of the $k_1$-th bit (the $k_1$-th digit) and the $k_2$-th bit (the $k_2$-th digit) of the beam 1 to the (k+1) group composed of the $k_3$-th bit (the $k_3$-th digit) and the $k_4$-th bit (the $k_4$-th digit). The irradiation time arrangement data shows the case of, for example, the $k_1$-th bit (the $k_1$-th digit) being "1", the $k_2$-th bit (the $k_2$-th digit) being "1", the $k_3$-th bit (the $k_3$-th digit) being "0", and the $k_4$-th bit (the $k_4$-th digit) being "1".

First, in response to an input of a read signal of the k group composed of the $k_1$-th bit (the $k_1$-th digit) and the $k_2$-th bit (the $k_2$-th digit), the individual register 42 (an individual register signal 1 and an individual register signal 2) outputs an ON/OFF signal, according to the stored data (two bits) of the $k_1$-th bit (the $k_1$-th digit) and the $k_2$-th bit (the $k_2$-th digit). In the first embodiment, since a 2-bit signal is used, it is necessary to perform selecting and switching the signal. In FIG. 14, first, data of the individual register 1 is selected by the selector 48, and an ON signal of the $k_1$-th bit (the $k_1$-th digit) is output to the individual amplifier. Next, with respect to an output of the individual register 42, data of the individual register 2 is selected by the switching of the selector 48, and the output of the $k_1$-th bit (the $k_1$-th digit) is switched to the output of the $k_2$-th bit (the $k_2$-th digit). Hereafter, switching like this is serially repeated for each irradiation step.

Since the data of the $k_1$-th bit ($k_1$-th digit) is ON data, the individual amplifier 46 (an individual amplifier 1) outputs an ON voltage to be applied to the blanking electrode 24 for the beam 1. On the other hand, in the logic circuit 132 for common blanking, ON or OFF is switched depending upon timing data of each irradiation step of (n+a) bits (e.g., ten bits). In the common blanking system, an ON signal is output during the irradiation time of each irradiation step of each group. For example, if $\Delta=1$ ns, the irradiation time of the first irradiation step (e.g., the irradiation step of k=0) is $\Delta \times 1=1$ ns. The irradiation time of the second irradiation step (e.g., the irradiation step of k=9d (the fourteenth digit)) is $\Delta \times 128=128$ ns. The irradiation time of the first irradiation step (e.g., the irradiation step of k=1) of the group 2 is $\Delta \times 2=2$ ns. The irradiation time of the second irradiation step (e.g., the irradiation step of k=9c (the thirteenth digit)) is $\Delta \times 128=128$ ns. Similarly, it becomes ON during the irradiation time of each irradiation step of each group, hereinafter. In the logic circuit 132, when inputting timing data of each irradiation step, the register 50 outputs ON data of the k-th digit (the k-th bit), the counter 52 counts the irradiation time of the k-th digit (the k-th bit), and controlling is performed to be OFF after the irradiation time has passed. Hereafter, beam irradiation is performed for each group in order.

As described above, according to the first embodiment, data transmission time period can be included in the total of the grouped irradiation time period in the irradiation step.

In the common blanking system, compared with ON/OFF switching of the individual blanking system, ON/OFF switching is performed after the voltage stabilization time (settling time) S1/S2 of the amplifier 46 has passed. In the example of FIG. 14, after the individual amplifier 1 has become ON and the settling time S1 of the individual amplifier 1 at the time of switching from OFF to ON has passed, the common amplifier becomes ON. Thereby, beam irradiation at an unstable voltage at the time of rise of the individual amplifier 1 can be eliminated. Then, the common amplifier becomes OFF when the irradiation time of the k-th digit (the k-th bit) being a target has passed. Consequently, in the case of both the individual amplifier and the common amplifier being ON, an actual beam becomes ON, and irradiates the target object 101. Therefore, it is controlled such that the ON time period of the common amplifier becomes an actual beam irradiation time period. On the other hand, in the case where the common amplifier becomes ON when the individual amplifier 1 is OFF, after the individual amplifier 1 becomes OFF and the settling time S2 of the individual amplifier 1 at the time of switching from ON to OFF has passed, the common amplifier becomes ON. Thereby, beam irradiation at an unstable voltage at the time of fall of the individual amplifier 1 can be eliminated.

As described above, in the individual beam ON/OFF switching step (S116), beam ON/OFF control is individually performed for each corresponding beam in multiple beams by a plurality of individual blanking systems (blanking plate 204, etc.), and, for each beam, with respect to each irradiation step (irradiation) of the k-th group, beam ON/OFF switching is performed by the individual blanking system for the beam concerned. In the example of FIG. 14, since the irradiation step of the $k_2$-th digit (the $k_2$-th bit) of the k-th group is not beam OFF, switching from ON to OFF is not performed. However, for example, if the irradiation step of the $k_2$-th digit (the $k_2$-th bit) is beam OFF, it should be understood that switching from ON to OFF is performed.

In the common beam ON/OFF switching step (S118), for each beam, with respect to each irradiation step (irradiation) of the k-th group, after performing beam ON/OFF switching by the individual blanking system, beam ON/OFF controlling is performed all at once for the whole of the multiple beams by using the common blanking system (the logic circuit 132, the deflector 212, etc.), and blanking control is performed so that it may be in a beam ON state during the irradiation time corresponding to each irradiation step (irradiation) of the k-th group.

As described above, since there is a restriction on the installation area of the circuit and the current to be used in the circuit in the blanking plate 204, a simple amplifier circuit is used. Therefore, it is also limited in reducing the settling time of the individual amplifier. By contrast, in the common blanking system, a highly precise amplifier circuit of sufficient size, current, and scale can be installed outside the optical column. Therefore, the settling time of the common amplifier can be shortened. Thus, according to the first embodiment, by making beam ON by the common blanking system after becoming beam ON by the individual blanking system (or after a read signal of a target digit is output) and after the settling time having passed, it becomes possible to eliminate a voltage unstable time of the individual amplifier and a noise component containing crosstalk, on the blanking plate, and to perform a blanking operation based on a highly precise irradiation time.

In the determination step (S120), the writing control unit 72 determines, with respect to irradiation time arrangement data, whether transmission of data of all the groups has been completed or not. When it has not been completed yet, it proceeds to the group change step (S122). When it has been completed, it proceeds to the determination step (S124).

In the group change step (S122), the writing control unit 72 changes a target group. For example, the writing control unit 72 changes the target group (or "target digit") from the k-th group to the (k+1)th group. Then, it returns to the data transmission step (S112) of the target group. With respect to the processing of the (k+1)th group, steps from the data transmission step (S112) to the group change step (S122) of the target group are executed. Then, it is similarly repeated until data processing of irradiation time arrangement data of all the groups has been completed in the determination step (S120).

As described above, a maximum irradiation time period ($2^n-1$) per shot of beams of the multiple beams is divided into a plurality, being a digit number "n" set in advance, of irradiation time periods (first irradiation time periods), each of which is calculated by multiplying a corresponding gray scale value (second gray scale value) of a plurality of gray scale values (second gray scale values) by a quantization unit $\Delta$, where the plurality of gray scale values (second gray scale values) are gray scale values defined in decimal numbers converted from each digit value of data of binary numbers of the digit number "n". A plurality of irradiation time periods irradiation time periods (second irradiation time periods), which are a part of the plurality of irradiation time periods (first irradiation time periods), are divided into a plurality of irradiation time periods (third irradiation time periods). Further, irradiation of each beam of the multiple charged particle beams by using the plurality of irradiation time periods (third irradiation time periods) and remaining undivided plurality of irradiation time periods (first irradiation time periods), is divided into irradiation steps (first irradiation steps) of the plurality of irradiation time periods (third irradiation time periods) and irradiation steps (second irradiation steps) of the remaining undivided plurality of irradiation time periods (first irradiation time periods). Then, a target object is irradiated, in order, with the multiple beams such that the plurality of groups are respectively composed of combination of at least two irradiation steps of the irradiation steps (first irradiation steps) and the irradiation steps (second irradiation steps) and the plurality of groups continue in order, for each group of a plurality of groups in each shot of beams.

The electron beam 200 emitted from the electron gun assembly 201 (emission unit) almost perpendicularly illuminates the whole of the aperture member 203 by the illumination lens 202. A plurality of holes (openings), each being a quadrangle, are formed in the aperture member 203. The region including all the plurality of holes is irradiated with the electron beam 200. For example, a plurality of quadrangular electron beams (multiple beams) 20a to 20e are formed by letting parts of the electron beam 200 irradiating the positions of a plurality of holes pass through a corresponding hole of the plurality of holes of the aperture member 203 respectively. The multiple beams 20a to 20e respectively pass through a corresponding blanker (the first deflector: individual blanking system) of the blanking plate 204. Each blanker respectively deflects (performs blanking deflection) the electron beam 20 passing individually.

Figure 15:
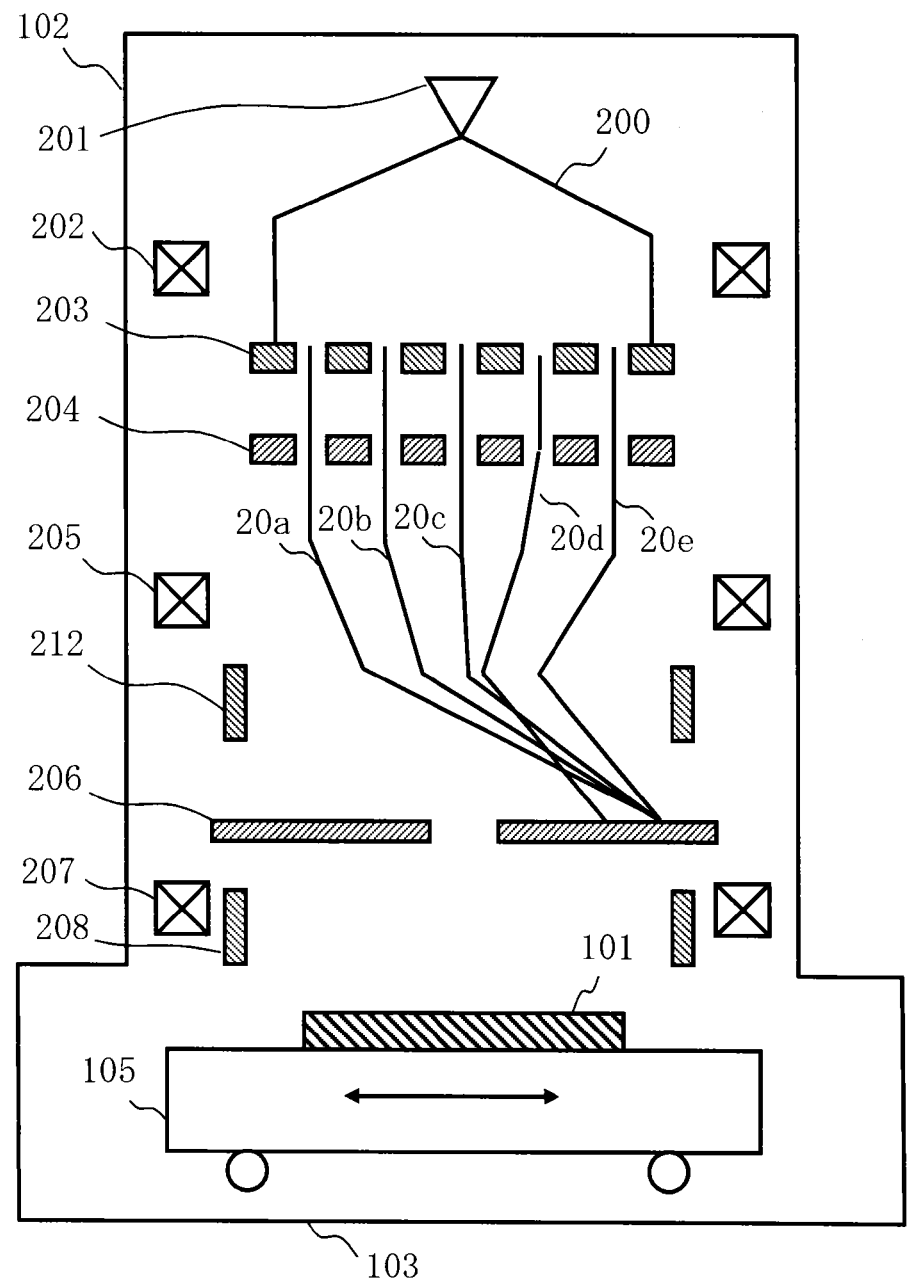
FIG. 15 is a schematic diagram explaining a blanking operation according to the first embodiment.

FIG. 15 is a schematic diagram explaining a blanking operation according to the first embodiment. The multiple beams 20a, 20b, . . . , 20e, having passed through the blanking plate 204 are reduced by the reducing lens 205, and go toward the hole at the center of the limiting aperture member 206. At this stage, the electron beam 20 which was deflected by the blanker of the blanking plate 204 deviates from the hole of the center of the limiting aperture member 206 (blanking aperture member) and is blocked by the limiting aperture member 206. On the other hand, if the electron beam 20 which was not deflected by the blanker of the blanking plate 204 is not deflected by the deflector 212 (common blanking system), it passes through the hole at the center of the limiting aperture member 206, as shown in FIG. 1. Blanking control is performed by combination of ON/OFF of the individual blanking system and ON/OFF of the common blanking system so as to control ON/OFF of the beam. Thus, the limiting aperture member 206 blocks each beam which was deflected to be a beam OFF state by the individual blanking system or the common blanking system. Then, beam of an irradiation step obtained by dividing one beam shot is formed by beams having been made during from a beam ON state to a beam OFF state and having passed through the limiting aperture member 206. The multi-beams 20 having passed through the limiting aperture member 206 are focused by the objective lens 207 in order to be a pattern image of a desired reduction ratio, and respective beams (the entire multi-beams 20) having passed through the limiting aperture member 206 are collectively deflected in the same direction by the deflector 208 so as to irradiate respective irradiation positions on the target object 101. While the XY stage 105 is continuously moving, controlling is performed by the deflector 208 so that irradiation positions of beams may follow the movement of the XY stage 105, for example. Ideally, multi-beams 20 to irradiate at a time are aligned at pitches obtained by multiplying the arrangement pitch of a plurality of holes of the aperture member 203 by a desired reduction ratio described above. The writing apparatus 100 performs a writing operation by the raster scan method which continuously irradiates shot beams in order, and when writing a desired pattern, a required beam is controlled by blanking control to be ON according to the pattern.

In the determination step (S124), the writing control unit 72 determines whether all the shots have been completed. If all the shots have been completed, it ends. If all the shots have not been completed yet, it returns to the gray level value N calculation step (S106), and the steps from the gray level value N calculation step (S106) to the determination step (S124) are repeated until all the shots have been completed.

Figure 16:
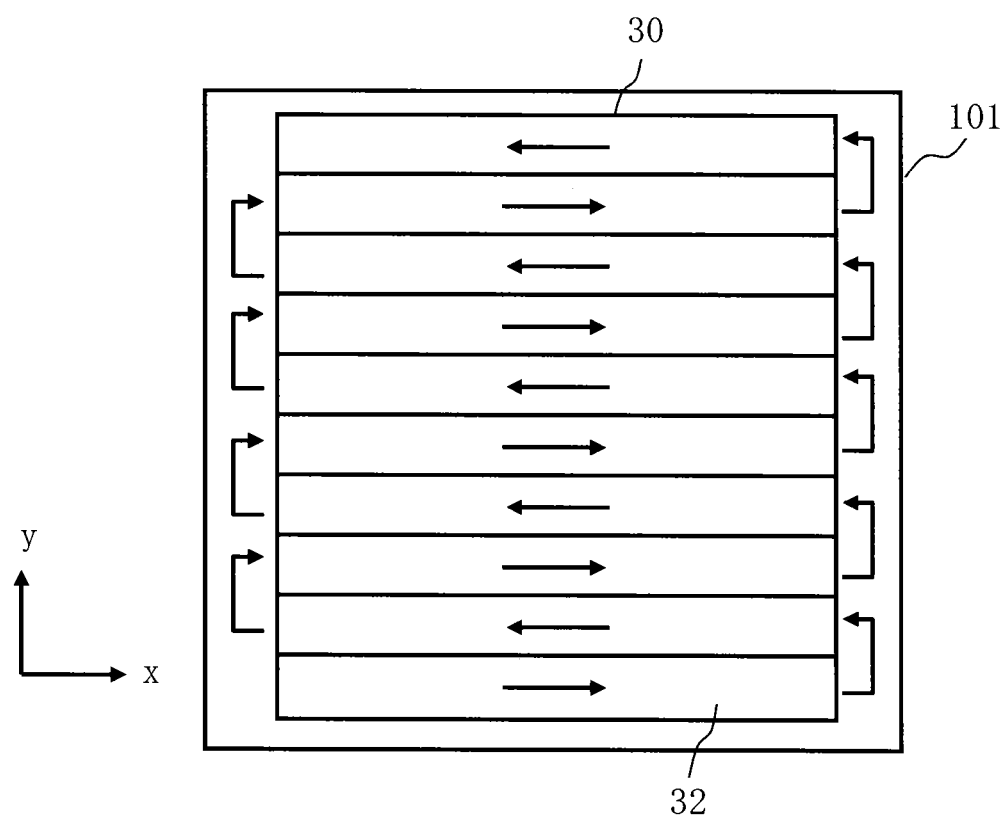
FIG. 16 is a conceptual diagram explaining an example of a writing operation according to the first embodiment.

FIG. 16 is a conceptual diagram explaining a writing operation according to the first embodiment. As shown in FIG. 16, a writing region 30 of the target object 101 is virtually divided into a plurality of strip-shaped stripe regions 32 each having a predetermined width in the y direction, for example. Each of the stripe regions 32 serves as a writing unit region. The XY stage 105 is moved and adjusted such that an irradiation region 34 to be irradiated with one-time irradiation of the multi-beams 20 is located at the left end of the first stripe region 32 or at a position more left than the left end, and then writing is started. When writing the first stripe region 32, the writing advances relatively in the x direction by moving the XY stage 105 in the –x direction, for example. The XY stage 105 is continuously moved at a predetermined speed, for example. After writing the first stripe region 32, the stage position is moved in the –y direction and adjusted such that the irradiation region 34 is located at the right end of the second stripe region 32 or at a position more right than the right end and located to be relatively in the y direction. Then, similarly, writing advances in the –x direction by moving the XY stage 105 in the x direction, for example. That is, writing is performed while alternately changing the direction, such as performing writing in the x direction in the third stripe region 32, and in the –x direction in the fourth stripe region 32, and thus, the writing time can be reduced. However, the writing operation is not limited to the case of performing writing while alternately changing the direction, and it is also acceptable to perform writing in the same direction when writing each stripe region 32. By one shot, a plurality of shot patterns of the same number as the holes 22 are formed at a time by multiple beams which have been formed by passing through respective corresponding holes 22 of the aperture member 203.

Figure 17A:
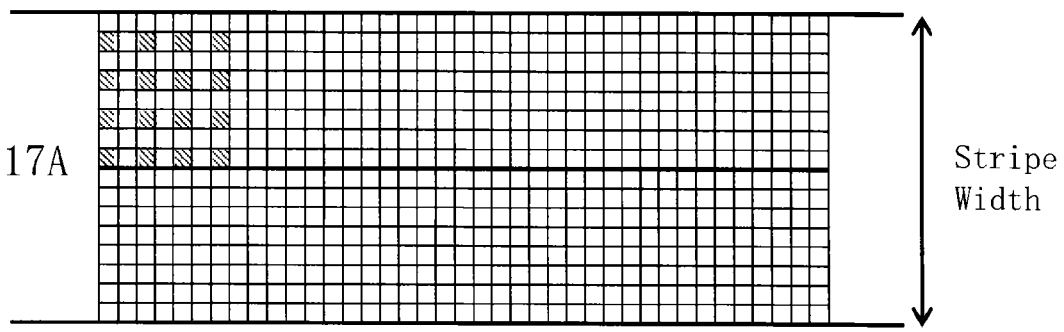
FIGS. 17A to 17C are conceptual diagrams explaining examples of a writing operation in a stripe according to the first embodiment.
Figure 17B:
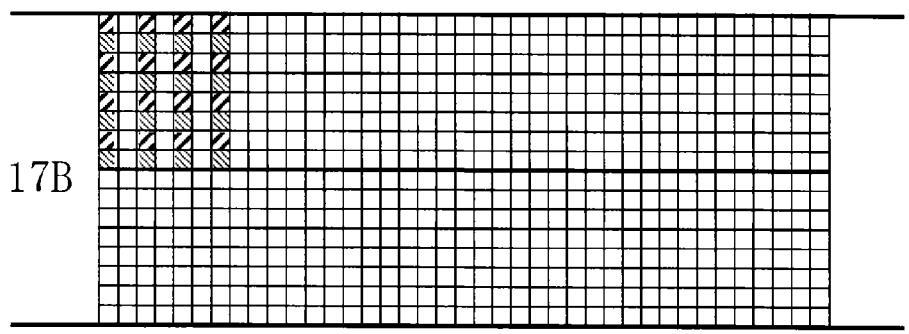
Figure 17C:
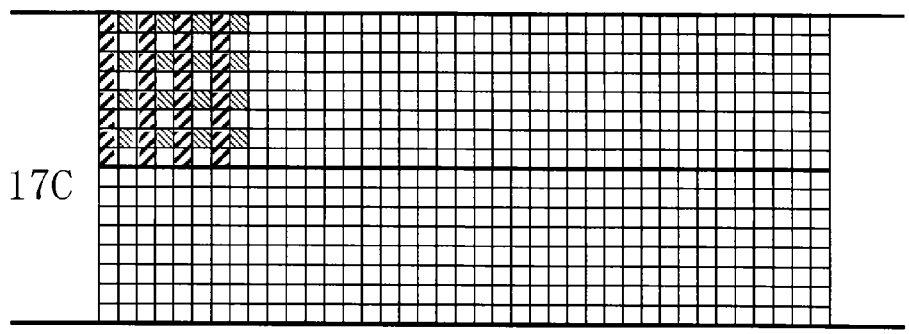

FIGS. 17A to 17C are conceptual diagrams explaining examples of a writing operation in a stripe according to the first embodiment. The examples of FIGS. 17A to 17C show the cases where writing is performed in a stripe by using multiple beams of 4×4 in the x and y directions, for example. The examples of FIGS. 17A to 17C show the cases where a stripe region is divided in the y direction by twice the width of an irradiation region of the whole multi-beam, for example. There is shown the case where exposure (writing) of one irradiation region of the whole of multiple beams is completed by four shots (one shot is a total of a plurality of irradiation steps) performed while shifting the irradiation position by one mesh in the x direction or the y direction. First, the upper region of the stripe region is to be written. FIG. 17A shows the mesh region irradiated by the first one-shot (one shot is a total of a plurality of irradiation steps). Next, as shown in FIG. 17B, the second one-shot (one shot is a total of a plurality of irradiation steps) is performed while shifting the position in the y direction to the mesh region not having been irradiated yet. Next, as shown in FIG. 17C, the third one-shot (one shot is a total of a plurality of irradiation steps) is performed while shifting the position in the x direction to the mesh region not having been irradiated yet.

Figure 18A:
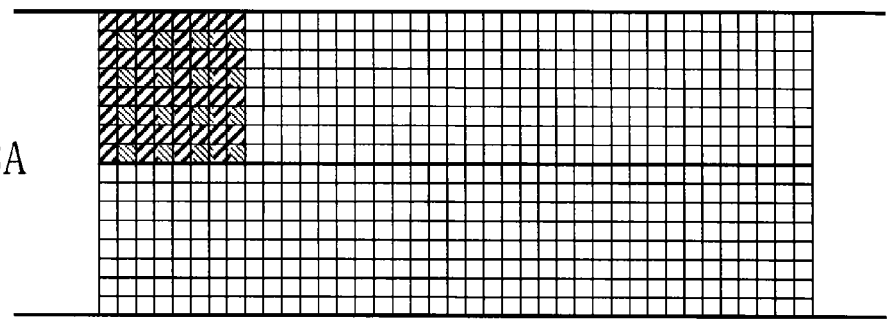
FIGS. 18A to 18C are conceptual diagrams explaining examples of a writing operation in a stripe according to the first embodiment.
Figure 18B:
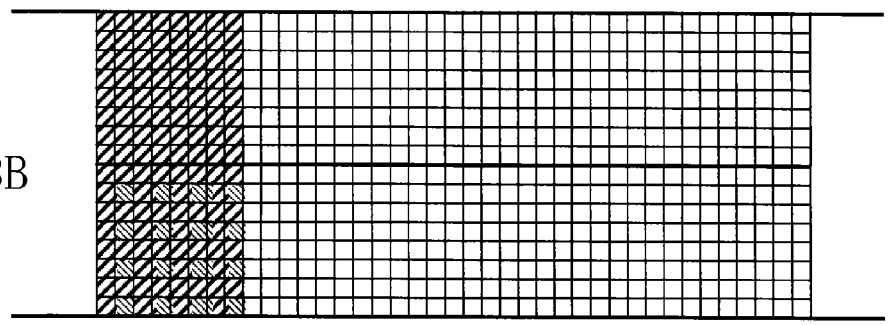
Figure 18C:
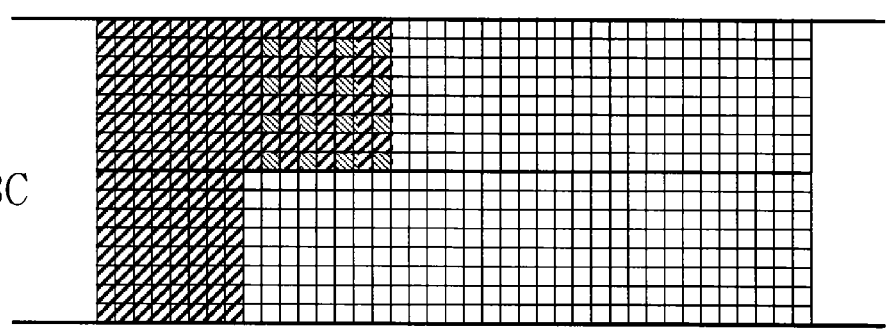

FIGS. 18A to 18C are conceptual diagrams explaining examples of a writing operation in a stripe according to the first embodiment. FIGS. 18A to 18C are continued from FIG. 17C. As shown in FIG. 18A, the fourth one-shot (one shot is a total of a plurality of irradiation steps) is performed while shifting the position in the y direction to the mesh region not having been irradiated yet. Exposure (writing) of one irradiation region of the whole of multiple beams is completed by these four shots (one shot is a total of a plurality of irradiation steps). Next, the lower region of the stripe region is to be written. As shown in FIG. 18B, the lower region of the stripe region is irradiated by the first one-shot (one shot is a total of a plurality of irradiation steps). Next, the second one-shot (one shot is a total of a plurality of irradiation steps) is performed while shifting the position in the y direction to the mesh region not having been irradiated yet. Next, the third one-shot (one shot is a total of a plurality of irradiation steps) is performed while shifting the position in the x direction to the mesh region not having been irradiated yet. The fourth one-shot (one shot is a total of a plurality of irradiation steps) is performed while shifting the position in the y direction to the mesh region not having been irradiated yet. By the operations described above, writing of the first row of the irradiation region of multiple beams in the stripe region is completed. Then, as shown in FIG. 18C, writing is to be similarly performed for the second row of the multiple beam irradiation region while shifting the position in the x direction. The whole stripe region can be written by repeating the operations described above.

Figure 19A:
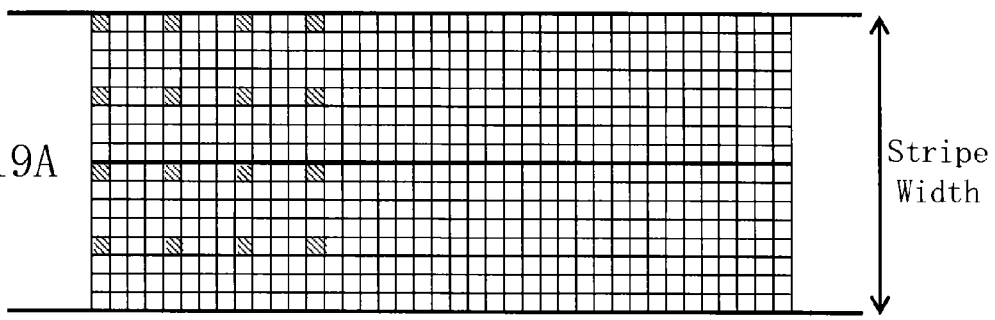
FIGS. 19A to 19C are conceptual diagrams explaining other examples of a writing operation in a stripe according to the first embodiment.
Figure 19B:
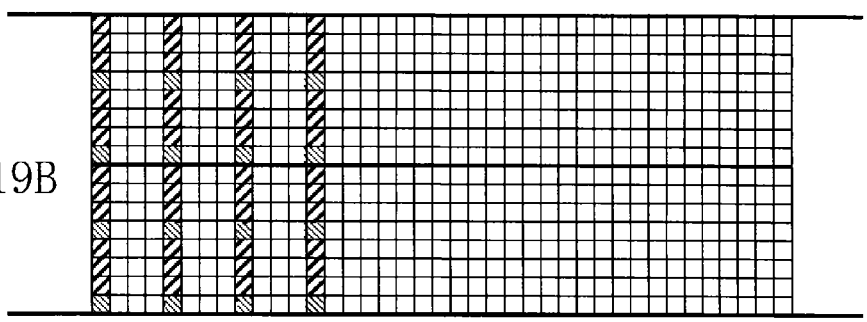
Figure 19C:
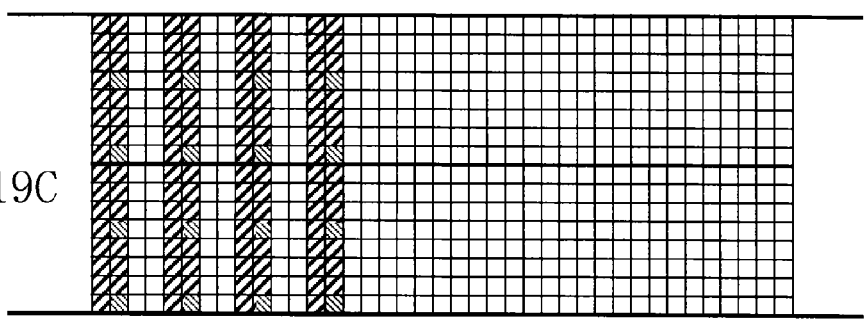

FIGS. 19A to 19C are conceptual diagrams explaining other examples of a writing operation in a stripe according to the first embodiment. FIGS. 19A to 19C show examples in which writing in a stripe is performed using 4×4 multiple beams in the x and y directions. The examples of FIG. 19A to FIG. 19C show the case where there is a distance between beams and a stripe region is divided in the y direction by a width somewhat greater than or equal to the irradiation region of the whole of multiple beams, for example. Exposure (writing) of one irradiation region by the whole of multiple beams is completed by sixteen shots (one shot is a total of a plurality of irradiation steps) performed while shifting the irradiation position by one mesh in the x direction or the y direction. FIG. 19A shows the mesh region irradiated by the first one-shot (one shot is a total of a plurality of irradiation steps). Next, as shown in FIG. 19B, the second one-shot, the third one-shot, and the fourth one-shot (one shot is a total of a plurality of irradiation steps) are performed while shifting the position by one mesh, one by one, in the y direction to the mesh region not having been irradiated yet. Next, as shown in FIG. 19C, the fifth one-shot (one shot is a total of a plurality of irradiation steps) is performed while shifting the position by one mesh in the x direction to the mesh region not having been irradiated yet. Next, the sixth one-shot, the seventh one-shot, and the eighth one-shot (one shot is a total of a plurality of irradiation steps) are performed while shifting the position by one mesh, one by one, in the y direction to the mesh region not having been irradiated yet.

Figure 20A:
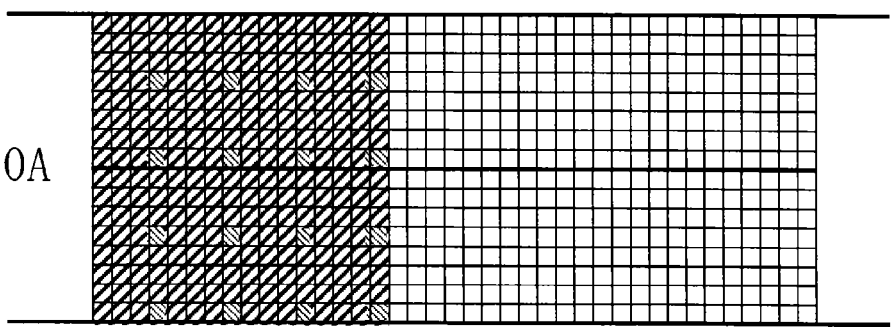
FIGS. 20A to 20C are conceptual diagrams explaining other examples of a writing operation in a stripe according to the first embodiment.
Figure 20B:
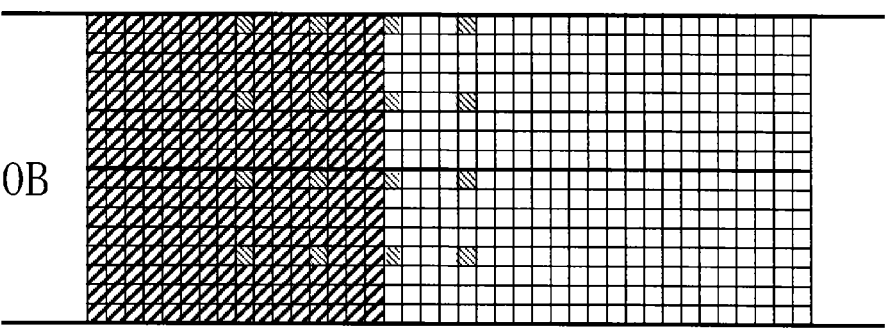
Figure 20C:
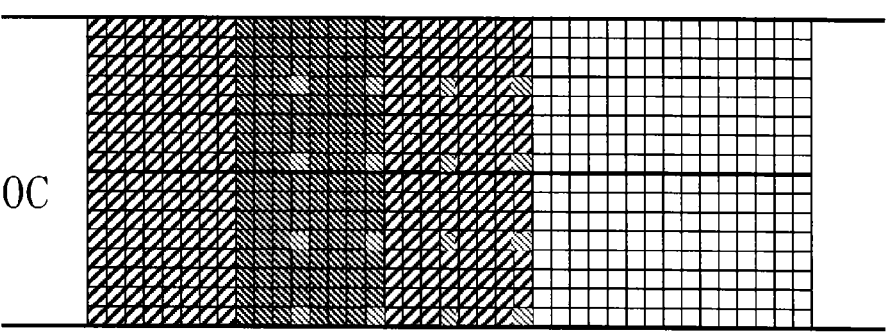

FIGS. 20A to 20C are conceptual diagrams explaining other examples of a writing operation in a stripe according to the first embodiment. FIGS. 20A to 20C are continued from FIG. 19C. As shown in FIG. 20A, the ninth one-shot to the sixteenth one-shot (one shot is a total of a plurality of irradiation steps) are repeatedly performed in order similarly to the operations of FIGS. 19A to 19C. The examples of FIGS. 19A to 19C and 20A to 20C show the case of performing multi-pass writing (multiplicity=2), for example. In such a case, the irradiation position is shifted in the x direction by about half the size of the irradiation region of the whole of multiple beams, and as shown in FIG. 20B, the first one-shot (one shot is a total of a plurality of irradiation steps) of the second layer of the multi-pass writing is performed. As described referring to FIGS. 19B and 19C, the second one-shot to the eighth one-shot (one shot is a total of a plurality of irradiation steps) of the second layer of the multi-pass writing are performed one by one, hereinafter. As shown in FIG. 20C, the ninth one-shot to the sixteenth one-shot (one shot is a total of a plurality of irradiation steps) are to be repeatedly performed in order similarly to the operations of FIGS. 19B to 19C.

As described above, according to the first embodiment, the latency time of beam irradiation operation due to data transmission time can be reduced or avoided while maintaining the restriction on a circuit installation space.

Moreover, according to the first embodiment, the precision of irradiation time control and, further, the precision of dose control can be improved while maintaining the restriction on a circuit installation space. Furthermore, since the data amount of the logic circuit 41 of the individual blanking system is one bit, power consumption can be suppressed.

Second Embodiment

Although the first embodiment shows the case where the quantization unit Δ (a counter period of the common blanking system) is set uniquely, it is not limited thereto. The second embodiment describes the case where the quantization unit Δ is set variably. The apparatus structure according to the second embodiment is the same as that of FIG. 1. The flowchart showing main steps of a writing method according to the second embodiment is the same as that of FIG. 6. The content of the second embodiment is the same as that of the first embodiment except what is particularly described below.

Figure 21A:
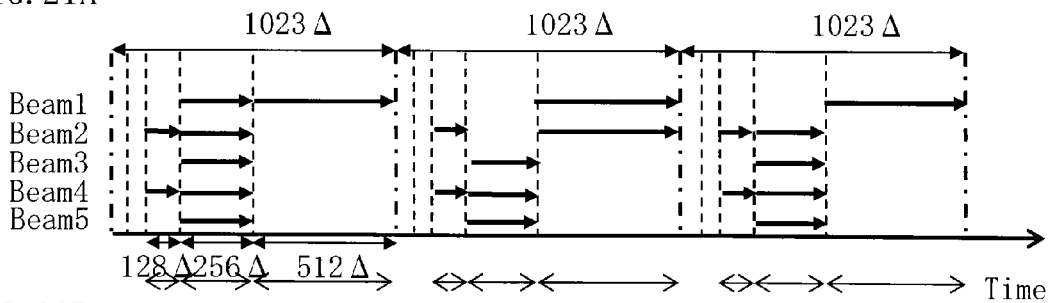
FIGS. 21A to 21E are time charts for comparing the exposure latency time according to the second embodiment.

FIGS. 21A to 21E are time charts for comparing the exposure latency time according to the second embodiment. FIG. 21A shows an example of performing beam irradiation or not performing beam irradiation of each beam in each irradiation step when dividing one shot into "n" irradiation steps. In the case of dividing a shot into "n" irradiation steps, the irradiation time per shot is $(2^n-1)$ at the maximum. FIG. 21A shows the case of n=10, as an example. In such a case, the irradiation time per shot is 1023Δ at the maximum. In FIG. 21A, the irradiation time per shot is divided into irradiation steps of 10 times: 512 Δ, 256Δ, 128Δ, 64Δ, 32Δ, 16Δ, 8Δ, 4Δ, 2Δ, and 1Δ, which are described in order from the longer irradiation time. In FIG. 21A, irradiation steps whose irradiation time is less than 128Δ are not shown. In FIG. 21A, the beam 1 is OFF (no beam irradiation) in the irradiation step whose irradiation time is 128Δ, ON (beam irradiation) in the irradiation step whose irradiation time is 256Δ, and ON (beam irradiation) in the irradiation step whose irradiation time is 512Δ. The beam 2 is ON (beam irradiation) in the irradiation step whose irradiation time is 128Δ, ON (beam irradiation) in the irradiation step whose irradiation time is 256Δ, and OFF (no beam irradiation) in the irradiation step whose irradiation time is 512Δ. The beam 3 is OFF (no beam irradiation) in the irradiation step whose irradiation time is 128Δ, ON (beam irradiation) in the irradiation step whose irradiation time is 256Δ, and OFF (no beam irradiation) in the irradiation step whose irradiation time is 512Δ. The beam 4 is ON (beam irradiation) in the irradiation step whose irradiation time is 128Δ, ON (beam irradiation) in the irradiation step whose irradiation time is 256Δ, and OFF (no beam irradiation) in the irradiation step whose irradiation time is 512Δ. The beam 5 is OFF (no beam irradiation) in the irradiation step whose irradiation time is 128Δ, ON (beam irradiation) in the irradiation step whose irradiation time is 256Δ, and OFF (no beam irradiation) in the irradiation step whose irradiation time is 512Δ.

Figure 21B:
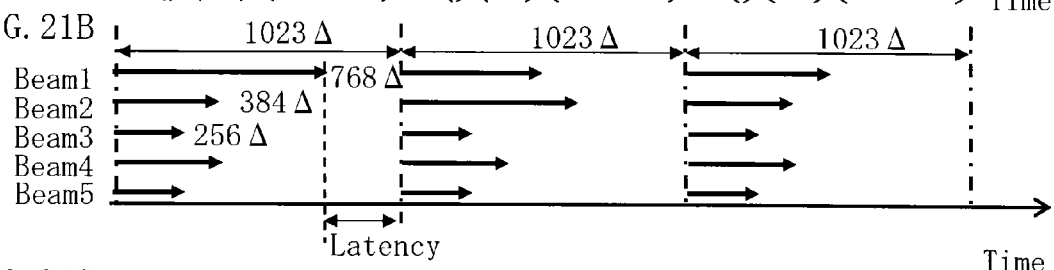

FIG. 21B shows an example of a total irradiation time per shot of each beam shown in FIG. 21A. FIG. 21B shows, as a comparative example, the case where the quantization unit Δ is set uniquely. Moreover, with respect to each beam shown in FIG. 21A, irradiation steps whose irradiation time is less than 128Δ are OFF (no beam irradiation). In such a case, as shown in FIG. 21B, the total irradiation time per shot of the beam 1 is 768Δ, for example. The total irradiation time per shot of the beam 2 is 384Δ, for example. The total irradiation time per shot of the beam 3 is 256Δ, for example. The total irradiation time per shot of the beam 4 is 384Δ, for example. The total irradiation time per shot of the beam 5 is 256Δ, for example. On the other hand, as described above, the irradiation time per shot is 1023Δ at the maximum. When the total irradiation time per shot of beams of each beam is shorter than the maximum irradiation time, a latency time occurs as shown in FIG. 21B. Then, in the second embodiment, the quantization unit Δ is made to be variable in order to reduce such a latency time.

Figure 21C:
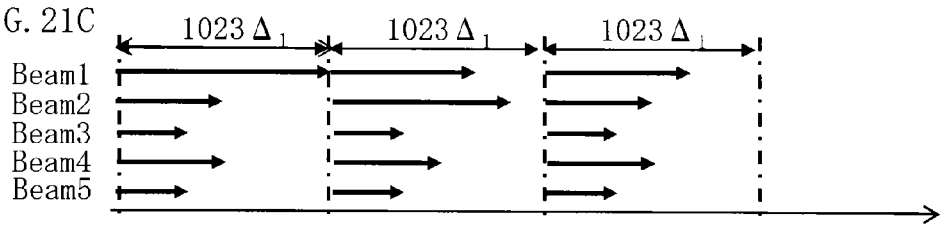

As shown in FIG. 21C, the quantization unit Δ is set such that the maximum value of the irradiation time per shot of beams corresponds to the total irradiation time per shot (a sum of irradiation time of irradiation steps per shot) of a beam in the case where the total irradiation time per shot of all the beams of multiple beams of all the shots is the maximum. In the example of FIG. 21B, the total irradiation time per shot of the beam 1 is 768Δ, and is the maximum. Therefore, a quantization unit $\Delta_1$ is set such that the maximum irradiation time 768Δ per shot corresponds to $1023\Delta_1$. Thereby, the repetition period (interval) of each shot can be shortened.

Figure 21D:
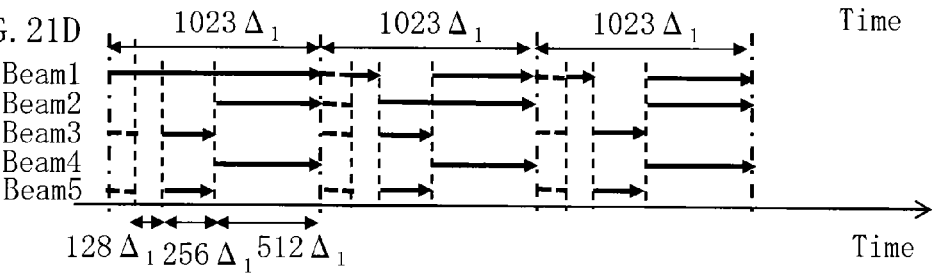

FIG. 21D shows, treating the maximum irradiation time 768Δ as $1023\Delta_1$, an example of irradiation or no irradiation of each beam in each irradiation step in the case of again dividing one shot into ten irradiation steps. In FIG. 21D, irradiation steps whose irradiation time is less than 128Δ are not shown. Since the beam 1 in FIG. 21D is a beam being a standard of a repetition period, it is set to be in the ON state (beam irradiation) in all the irradiation steps. Since the beams 2 and 4 are 384Δ, when converted, they become about $512\Delta_1$. Therefore, they are ON (beam irradiation) in the irradiation step whose irradiation time is $512\Delta_1$, and OFF (no beam irradiation) in the other irradiation steps. Since beams 3 and 5 are 256Δ, when converted, they become $341\Delta_1$. Therefore, they are ON (beam irradiation) in the irradiation steps whose irradiation time is $256\Delta_1$, $64\Delta_1$, $16\Delta_1$, $4\Delta_1$, or $1\Delta_1$, and OFF (no beam irradiation) in the other irradiation steps.

Figure 21E:
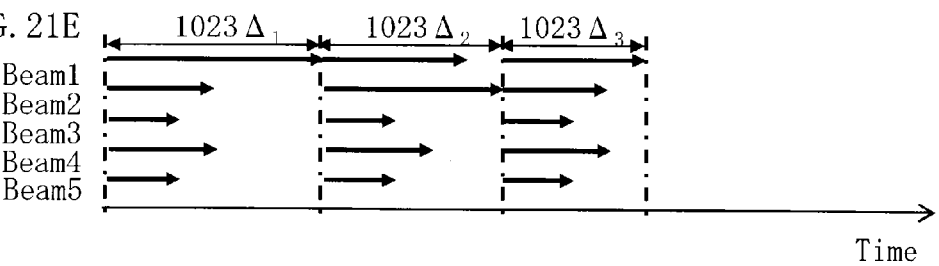

In FIG. 21E, for each shot, the quantization unit Δ is set such that the maximum value of the irradiation time per shot corresponds to the total irradiation time per shot of a beam in the case where the total irradiation time per shot of all the beams of multiple beams is the maximum. In the example of FIG. 21E, the total irradiation time per shot of the first one-shot of the beam 1 is 768Δ, which is the maximum. Therefore, the quantization unit $\Delta_1$ is set such that the maximum irradiation time 768Δ per shot corresponds to $1023\Delta_1$. Thereby, the repetition period (interval) of the first one-shot can be shortened. Moreover, the total irradiation time per shot of the second one-shot of the beam 2 is 640Δ, which is the maximum. Therefore, the quantization unit $\Delta_2$ is set such that the maximum irradiation time 640Δ per shot corresponds to $1023\Delta_2$. Thereby, the repetition period (interval) of the second one-shot can be shortened. Similarly, for each shot, $\Delta_3$, $\Delta_4$, . . . is to be set, hereinafter.

As described above, the quantization unit Δ is made to be variable. Thereby, the latency time can be suppressed. Therefore, writing time can be shortened. Although the case of n=10 is shown as an example in FIGS. 21A to 21E, other case, namely the case other than n=10, is also similarly applicable.

As described above, according to the second embodiment, it is possible to reduce or suppress the latency time at the time of performing irradiation steps.

Third Embodiment

Although, in each embodiment described above, blanking control is performed for each of a plurality of irradiation steps made by dividing one shot, for each beam, by using the blanking plate 204 for individual blanking control and the deflector 212 for common blanking, it is not limited thereto. In the third embodiment, there will be described a configuration in which blanking control is performed for each of a plurality of irradiation steps made by dividing one shot, for each beam, by using the blanking plate 204 for individual blanking control without using the deflector 212 for common blanking.

Figure 22:
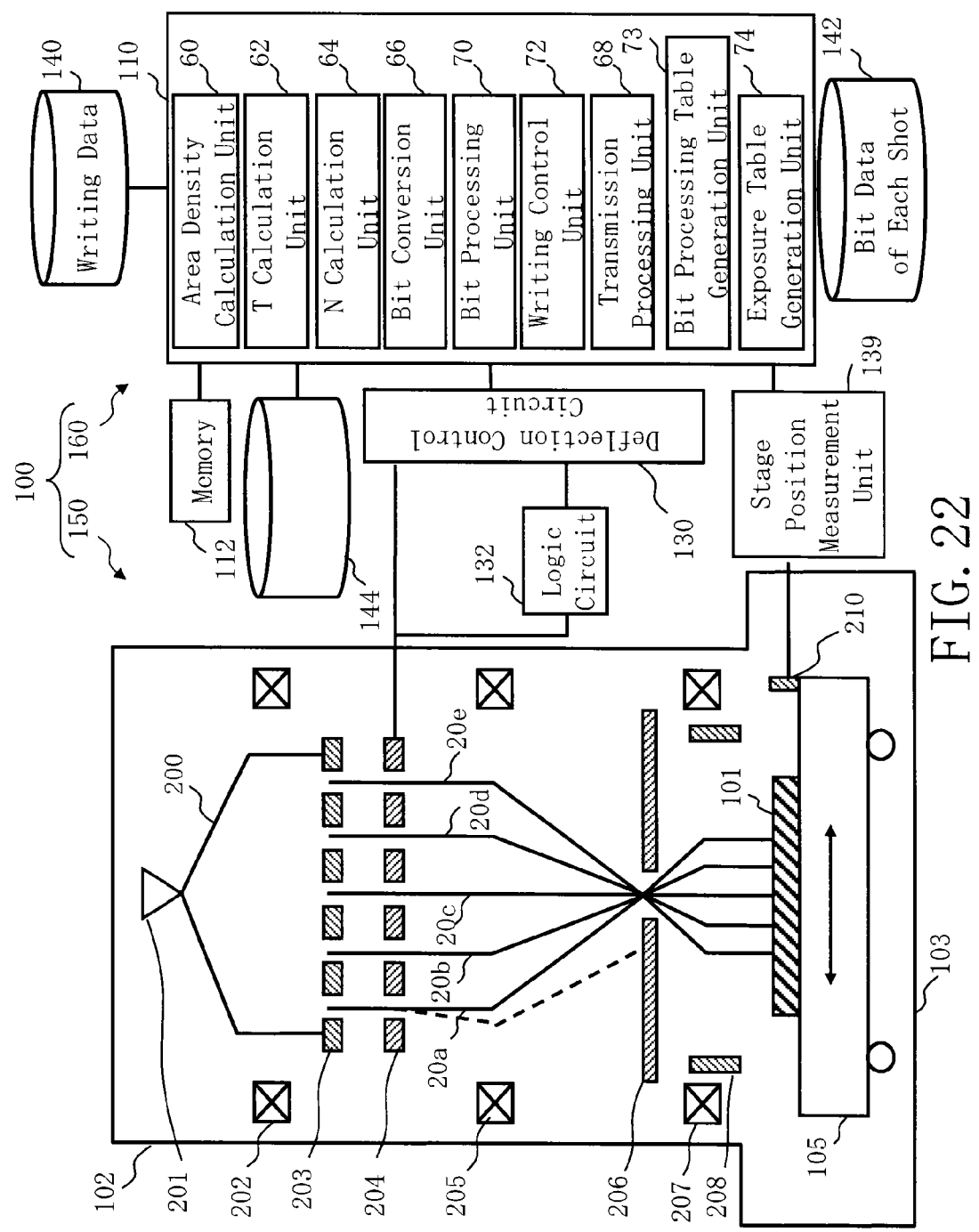
FIG. 22 is a schematic diagram showing the structure of a writing apparatus according to the third embodiment.

FIG. 22 is a schematic diagram showing the structure of a writing apparatus according to the third embodiment. FIG. 22 is the same as FIG. 1 except that the deflector 212 does not exist and output of the logic circuit 132 is connected to the blanking plate 204. Main steps of a writing method according to the third embodiment are the same as those of FIG. 6. The content of the third embodiment is the same as that of the first embodiment except what is particularly described below.

Figure 23:
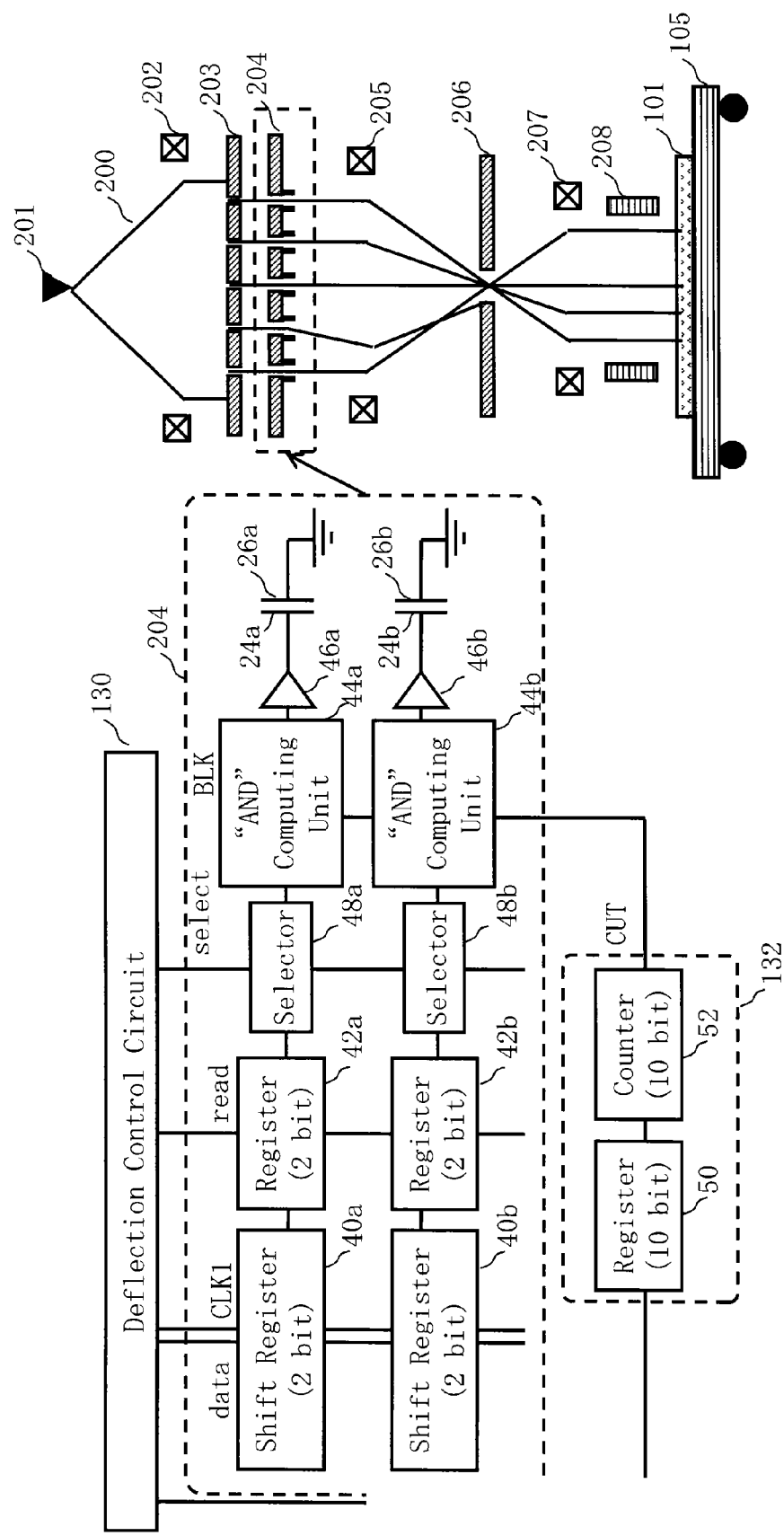
FIG. 23 is a schematic diagram showing the internal structure of an individual blanking control circuit and a common blanking control circuit according to the third embodiment.

FIG. 23 is a schematic diagram showing the internal structure of an individual blanking control circuit and a common blanking control circuit according to the third embodiment. The content of FIG. 23 is the same as that of FIG. 5 except that the deflector 212 does not exist and an output signal of the logic circuit 132 is input into the AND computing unit 44 (AND circuit) instead of a signal from the deflection control circuit 130.

In the individual beam ON/OFF switching step (S116), an ON/OFF control signal (first ON/OFF control signal) for a beam is output by the logic circuit (first logic circuit) of the beam concerned, for each beam, with respect to each of a plurality of times of irradiation, by using a plurality of logic circuits (first logic circuit) each including the shift register 40 and the individual register 42 each respectively outputting a beam ON/OFF control signal to a corresponding beam in multiple beams. Specifically, as described above, when inputting 2-bit data of the k-th group, the individual register 42 of each beam outputs an ON/OFF signal to the AND computing unit 44 through the selector 48 based on the input data. If the data of the k-th group is "11", two ON signals are to be output, and if the data is "00", two OFF signals are to be output.

In the common beam ON/OFF switching step (S118), for each beam, with respect to each of a plurality of times of irradiation, after a beam ON/OFF control signal has been switched by the logic circuit for individual blanking, a beam ON/OFF control signal (second ON/OFF control signal) is output so that a beam may be in the ON state during the irradiation time corresponding to the irradiation concerned, by using the logic circuit 132 (second logic circuit) which collectively outputs a beam ON/OFF control signal to the whole of multiple beams. Specifically, in the logic circuit 132 for common blanking, ON/OFF is switched depending upon 10-bit timing data of each irradiation step. The logic circuit 132 outputs an ON/OFF control signal to the AND computing unit 44. In the logic circuit 132, an ON signal is output during the irradiation time of each irradiation step.

In the blanking control step, the AND computing unit 44 performs blanking control so that a beam concerned may be in the ON state during the irradiation time corresponding to the irradiation concerned, when both the ON/OFF control signal for an individual beam and the ON/OFF control signal for a common beam are ON control signals. When both the ON/OFF control signal for an individual beam and the ON/OFF control signal for a common beam are ON control signals, the AND computing units 44 outputs an ON signal to the amplifier 46, and, then, the amplifier 46 applies an ON voltage to the electrode 24 of the individual blanking deflector. In other case, the AND computing unit 44 outputs an OFF signal to the amplifier 46, and, then, the amplifier 46 applies an OFF voltage to the electrode 24 of the individual blanking deflector. Thus, when both the ON/OFF control signal for an individual beam and the ON/OFF control signal for a common beam are ON control signals, the electrode 24 (an individual blanking system) of the individual blanking deflector individually performs beam ON/OFF control so that the beam concerned may be in the ON state during the irradiation time corresponding to the irradiation concerned.

As described above, even when the blanking plate 204 for individual blanking control is used without using the deflector 212 for common blanking, the restriction on a circuit installation space can be maintained similarly to the first embodiment. Moreover, since the logic circuit 41 for individual blanking has a data amount of one bit, power consumption can also be suppressed. Furthermore, there is an advantage that the deflector 212 for common blanking can be omitted.

Fourth Embodiment

In each embodiment described above, each logic circuit 41 for individual blanking control is arranged on the blanking plate 204, but, however, it may be arranged outside. In the fourth embodiment, the case of arranging each logic circuit 41 for individual blanking control outside the blanking plate 204 will be described. The apparatus structure according to the fourth embodiment is the same as that of FIG. 1 except that each logic circuit 41 for individual blanking control is arranged at the outside of the blanking plate 204. The flowchart showing main steps of a writing method according to the fourth embodiment is the same as that of FIG. 6. The content of the fourth embodiment is the same as that of one of the first to third embodiments except what is particularly described below.

Figure 24:
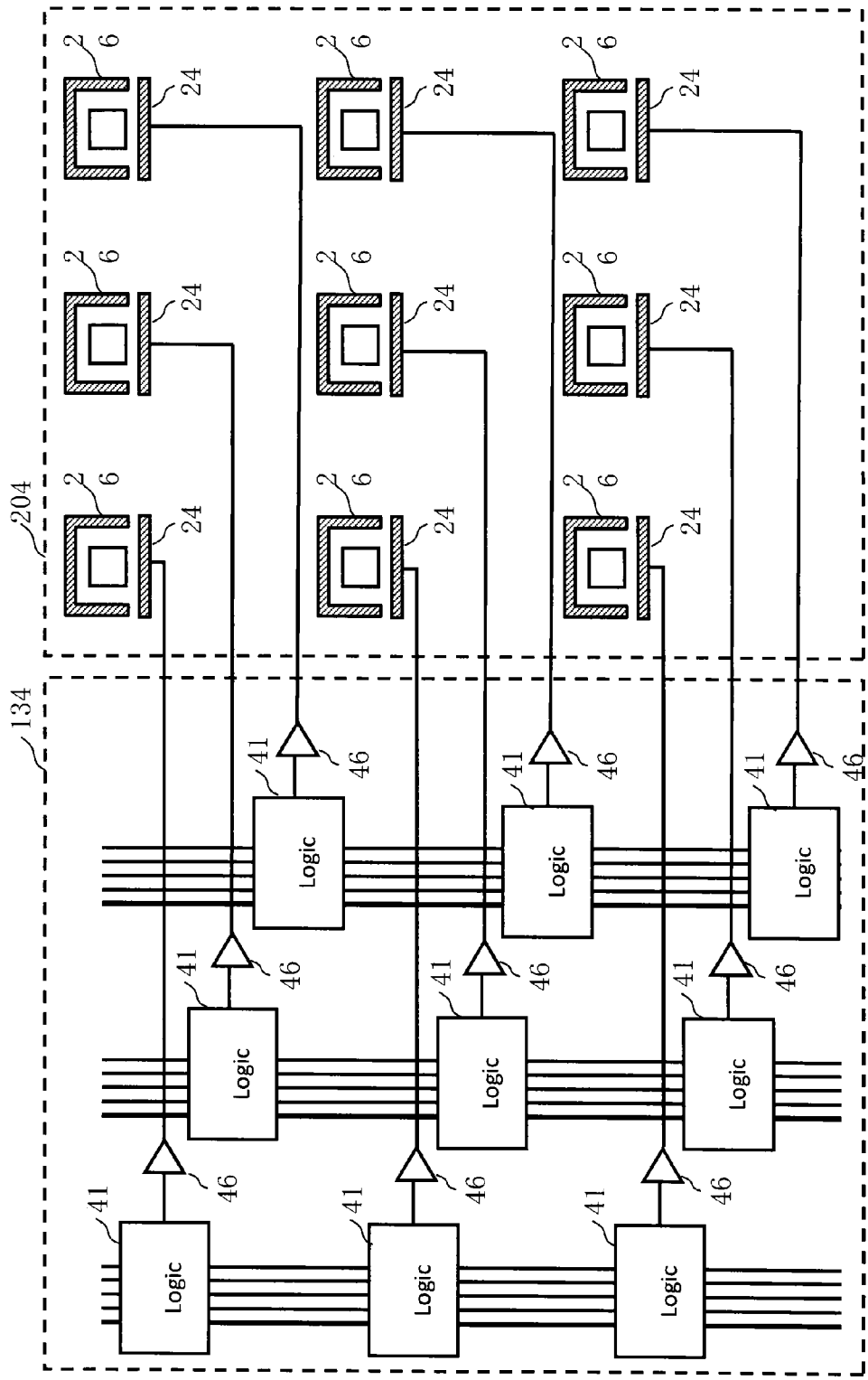
FIG. 24 is a schematic diagram explaining the arrangement state between the logic circuit and the blanking plate 204 according to the fourth embodiment.

FIG. 24 is a schematic diagram explaining the arrangement state between the logic circuit and the blanking plate 204 according to the fourth embodiment. In the fourth embodiment, each logic circuit 41 for individual blanking control and each amplifier 46 are arranged in the logic circuit 134 arranged outside the writing unit 150, and connected to each electrode 24 for individual blanking control by wiring. In such a structure, since the wiring becomes long, crosstalk and settling time increase. However, as described above, according to the fourth embodiment, since ON/OFF switching is performed by the common blanking system after having performed ON/OFF switching by the individual blanking system and having waited for voltage stability, the irradiation time can be controlled highly accurately without being affected by crosstalk and settling time even if they increase.

Fifth Embodiment

In the above embodiments, the case where each group is composed of two irradiation steps has been described, but however, it is not limited thereto. In the fifth embodiment, the case where each group is composed of three or more irradiation steps will be described. Hereafter, the contents of the fifth embodiment are the same as those of one of the embodiments described above except what is particularly explained below.

FIG. 25 shows an example of a grouped exposure table according to the fifth embodiment. FIG. 25 shows the case where irradiation per shot is divided into irradiation steps of twelve irradiation time periods (exposure time), for example. The example of FIG. 25 has a configuration so that the difference between the totals of grouped irradiation time composed of three irradiation steps may become smaller to be close to uniform. As the exposure step 1, the group 1 is composed of the irradiation time $\Delta$, the irradiation time 128$\Delta$, and the irradiation time 128$\Delta$. As the exposure step 2, the group 2 is composed of the irradiation time 32$\Delta$, the irradiation time 64$\Delta$, and the irradiation time 158$\Delta$. As the exposure step 3, the group 3 is composed of the irradiation time 8$\Delta$, the irradiation time 2$\Delta$, and the irradiation time 256$\Delta$. As the exposure step 4, the group 4 is composed of the irradiation time 4$\Delta$, the irradiation time 16$\Delta$, and the irradiation time 226$\Delta$. 128$\Delta$, 158$\Delta$, and 226$\Delta$ being the exposure time 3 of the exposure steps 1, 2, and 4 are obtained by dividing 512$\Delta$. That is, it is also preferable to make groups each composed of three irradiation steps as described above. In such a case, the data of each group is 3-bit data.

FIG. 26 shows another example of a grouped exposure table according to the fifth embodiment. FIG. 26 shows the case where irradiation per shot is divided into irradiation steps of twelve irradiation time periods (exposure time), for example. The example of FIG. 26 has a configuration so that the difference between the totals of grouped irradiation time composed of four irradiation steps may become smaller to be close to uniform. As the exposure step 1, the group 1 is composed of the irradiation time 4$\Delta$, the irradiation time 16$\Delta$, the irradiation time 64$\Delta$, and the irradiation time 256$\Delta$. As the exposure step 2, the group 2 is composed of the irradiation time 2$\Delta$, the irradiation time 8$\Delta$, the irradiation time 128$\Delta$, and the irradiation time 204$\Delta$. As the exposure step 3, the group 3 is composed of the irradiation time 1$\Delta$, the irradiation time 32$\Delta$, the irradiation time 128$\Delta$, and the irradiation time 180$\Delta$. 204$\Delta$ being the exposure time 4 of the exposure step 2, and 128$\Delta$ and 180$\Delta$ being the exposure time 3 and the exposure time 4 of the exposure step 3 are obtained by dividing 512$\Delta$. That is, it is also preferable to make groups each composed of four irradiation steps as described above. In such a case, the data of each group is 4-bit data. As has been described above, it is also preferable to configure each group by three or more irradiation steps.

Embodiments have been explained referring to concrete examples described above. However, the present invention is not limited to these specific examples.

While the apparatus configuration, control method, and the like not directly necessary for explaining the present invention are not described, some or all of them may be suitably selected and used when needed. For example, although description of the configuration of a control unit for controlling the writing apparatus 100 is omitted, it should be understood that some or all of the configuration of the control unit is to be selected and used appropriately when necessary.

In addition, any other multi charged particle beam writing apparatus and multi charged particle beam writing method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi charged particle beam writing method comprising:
converting, for each shot of beams of multiple charged particle beams, a respective first gray scale value of each beam of the multiple charged particle beams, which is obtained by dividing an individual irradiation time period of the each beam by a quantization unit, into respective data of binary numbers of a predetermined digit number set in advance;

dividing a maximum irradiation time period per shot of beams of the multiple charged particle beams into a plurality, being the predetermined digit number, of first irradiation time periods, each of which is calculated by multiplying a corresponding second gray scale value of a plurality of second gray scale values by the quantization unit, where the plurality of second gray scale values are gray scale values defined in decimal numbers converted from each digit value of data of binary numbers of the predetermined digit number;

dividing a plurality of second irradiation time periods, which are a part of the plurality of first irradiation time periods into a plurality of third irradiation time periods;

dividing irradiation of each beam of the multiple charged particle beams by using the plurality of third irradiation time periods and remaining undivided plurality of first irradiation time periods, into first irradiation steps which are irradiation steps of the plurality of third irradiation time periods and second irradiation steps which are irradiation steps of the remaining undivided plurality of first irradiation time periods; and irradiating, for each group of a plurality of groups in the each shot of beams, a target object, in order, with the multiple charged particle beams such that the plurality of groups are respectively composed of combination of at least two irradiation steps of first irradiation steps and second irradiation steps and the plurality of groups continue in order.

2. The method according to claim 1, wherein "b" number of the plurality of second irradiation time periods corresponding to a reference irradiation time T' that satisfies an equation (3) and an equation (4) are divided, where a combination number "m" of the at least two irradiation steps, a digit number "n" being the predetermined digit number, a quantization unit $\Delta$, and a first irradiation time period Ti of an i-th digit of data of binary numbers in "n" number of the plurality of first irradiation time periods are used in the equation (3) and the equation (4), and a number of irradiation time periods is increased from the digit number "n" by a number "a" corresponding to the reference irradiation time T' that satisfies the equation (3) and the equation (4), by dividing the plurality of second irradiation time periods.

$$T' = \frac{(2^n - 1)}{(n+a)/m} \Delta \quad (3)$$

$$T' > \frac{\sum_{i}^{Ti>T'} Ti}{a+b} \quad (4)$$

3. The method according to claim 2, wherein, in the plurality of first irradiation time periods, a number of first irradiation time periods Ti being greater than the reference irradiation time period T' are defined as "b" number of the plurality of second irradiation time periods, and the "b" number of the plurality of second irradiation time periods are divided into the plurality of third irradiation time periods so that the number of irradiation time periods is increased from the "n" number of the plurality of first irradiation time periods by the number "a", and each first irradiation step of the plurality of third irradiation time periods and each second irradiation step of remaining undivided plurality of first irradiation time periods are assigned to one of the plurality of groups so that a total irradiation time of each group is closer to the reference irradiation time T'.

4. The method according to claim 3, wherein the irradiation of the beam concerned is divided into respective irradiation steps of a plurality of irradiation time periods that configure the plurality of groups where a part of irradiation time periods of the at least two irradiation steps that configure at least one group of the plurality of groups is divided into a plurality of fourth irradiation time periods, and a part of the plurality of fourth irradiation time periods is assigned to other group.

5. The method according to claim 1, further comprising:
setting an initial value for a combination number "m" and an irradiation time increased number "a" which indicates that "n" plurality of irradiation time periods is increased by "a", where "n" is a digit number; and
calculating a reference irradiation time T' by solving a following equation (3) using the combination number "m", the digit number "n", the number "a" and a quantization unit $\Delta$.

$$T' = \frac{(2^n - 1)}{(n+a)/m} \Delta \quad (3)$$

6. The method according to claim 5, further comprising:
determining whether a calculated reference irradiation time T' satisfies a following equation (4) by using the number "a", a first irradiation time Ti of an i-th digit of binary numbers in "n" number of the plurality of first irradiation time periods, where "n" is the digit number, and number "b" indicating a partial number of irradiation time periods to be divided, in the "n" number of the plurality of first irradiation time periods.

$$T' > \frac{\sum_{i}^{Ti>T'} Ti}{a+b} \quad (4)$$

7. The method according to claim 6, further comprising:
changing the number "a" when the reference irradiation time T' does not satisfy the equation (4); and
calculating the reference irradiation time T' again using a changed number "a".

8. The method according to claim 6, further comprising:
dividing "b" number of the plurality of second irradiation time periods Ti, each of which is greater than the reference irradiation time T', in the "n" number of the plurality of first irradiation time periods, "n" being the digit number, into the plurality of third irradiation time periods so that a number of irradiation time periods is increased from the plurality of first irradiation time periods by the number "a".

9. A multi charged particle beam writing apparatus comprising:
a stage configured to mount a target object thereon and to be continuously movable;

an emission unit configured to emit a charged particle beam;

an aperture member, in which a plurality of openings are formed, configured to form multiple beams by letting a region including a whole of the plurality of openings be irradiated with the charged particle beam and letting portions of the charged particle beam respectively pass through a corresponding opening of the plurality of openings;

a plurality of blankers configured to respectively perform blanking deflection of a corresponding beam in the multiple beams having passed through the plurality of openings of the aperture member;

a blanking aperture member configured to block each beam having been deflected to be in a beam-off state by the plurality of blankers; and a deflection control unit configured to control a corresponding blanker of the plurality of blankers such that a maximum irradiation time period per shot of beams of the multiple beams is divided into a plurality, being a predetermined digit number set in advance, of first irradiation time periods, each of which is calculated by multiplying a corresponding second gray scale value of a plurality of second gray scale values by a quantization unit, where the plurality of second gray scale values are gray scale values defined in decimal numbers converted from each digit value of data of binary numbers of the predetermined digit number, a plurality of second irradiation time periods, which are a part of the plurality of first irradiation time periods, are divided into a plurality of third irradiation time periods, irradiation of each beam of the multiple charged particle beams by using the plurality of third irradiation time periods and remaining undivided plurality of first irradiation time periods is divided into first irradiation steps of the plurality of third irradiation time periods and second irradiation steps of the remaining undivided plurality of first irradiation time periods, and a target object is irradiated, in order, with the multiple charged particle beams such that a plurality of groups are respectively composed of combination of at least two irradiation steps of the first irradiation steps and the second irradiation steps and the plurality of groups continue in order, for each group of a plurality of groups in the each shot of beams.

10. The apparatus according to claim 9, further comprising:
a bit processing table generation unit configured to generate a bit processing table, which shows a relation between a place value "k" of bit data and an irradiation time corresponding to the place value "k", by using the plurality of third irradiation time periods and the remaining undivided plurality of first irradiation time periods.

11. A multi charged particle beam writing apparatus comprising:
a stage for mounting a target object thereon and being continuously movable;

an emission means for emitting a charged particle beam;

an aperture means, in which a plurality of openings are formed, for forming multiple beams by letting a region including a whole of the plurality of openings be irradiated with the charged particle beam and letting portions of the charged particle beam respectively pass through a corresponding opening of the plurality of openings;

a plurality of blankers for respectively performing blanking deflection of a corresponding beam in the multiple beams having passed through the plurality of openings of the aperture member;

a blanking aperture member for blocking each beam having been deflected to be in a beam-off state by the plurality of blankers; and a deflection control means for controlling a corresponding blanker of the plurality of blankers such that a maximum irradiation time period per shot of beams of the multiple beams is divided into a plurality, being a predetermined digit number set in advance, of first irradiation time periods, each of which is calculated by multiplying a corresponding second gray scale value of a plurality of second gray scale values by a quantization unit, where the plurality of second gray scale values are gray scale values defined in decimal numbers converted from each digit value of data of binary numbers of the predetermined digit number, a plurality of second irradiation time periods, which are a part of the plurality of first irradiation time periods, are divided into a plurality of third irradiation time periods, irradiation of each beam of the multiple charged particle beams by using the plurality of third irradiation time periods and remaining undivided plurality of first irradiation time periods is divided into first irradiation steps of the plurality of third irradiation time periods and second irradiation steps of the remaining undivided plurality of first irradiation time periods, and a target object is irradiated, in order, with the multiple charged particle beams such that a plurality of groups are respectively composed of combination of at least two irradiation steps of the first irradiation steps and the second irradiation steps and the plurality of groups continue in order, for each group of a plurality of groups in the each shot of beams.

* * * * *